United States Patent [19]
Krenik

[11] Patent Number: 5,283,582
[45] Date of Patent: Feb. 1, 1994

[54] CIRCUITRY AND METHOD FOR CURRENT INPUT ANALOG TO DIGITAL CONVERSION

[75] Inventor: William R. Krenik, Garland, Tex.

[73] Assignee: Texas Instruments Incorporated, Dallas, Tex.

[21] Appl. No.: 811,489

[22] Filed: Dec. 20, 1991

[51] Int. Cl.⁵ .............................................. H03M 1/34
[52] U.S. Cl. ..................................... 341/158; 341/159
[58] Field of Search ............... 341/158, 159, 160, 156, 341/135, 136, 133, 96

[56] References Cited

U.S. PATENT DOCUMENTS

| | | | |
|---|---|---|---|
| 4,229,729 | 10/1980 | Devendorf et al. | 341/159 |
| 4,608,555 | 8/1986 | Hoeft | 341/158 |
| 4,752,766 | 6/1988 | Shimizu et al. | 341/159 |
| 4,763,106 | 8/1988 | Gukzynski | 341/141 |
| 5,072,221 | 12/1991 | Schmidt | 341/159 |

*Primary Examiner*—A. D. Pellinen
*Assistant Examiner*—Brian K. Young
*Attorney, Agent, or Firm*—Alan K. Stewart; Richard L. Donaldson; William E. Hiller

[57] ABSTRACT

A method and circuitry are provided for current input analog to digital conversion. A current input (14) is conducted through an input path. The current input is directed through a plurality of current paths (30a-d). A current through each current path (30a-d) is compared against an associated reference current (36a-d), and a respective output signal (34a-d) indicative thereof is output, such that the respective output signals (34a-d) are indicative of a magnitude of the current input (14).

35 Claims, 9 Drawing Sheets

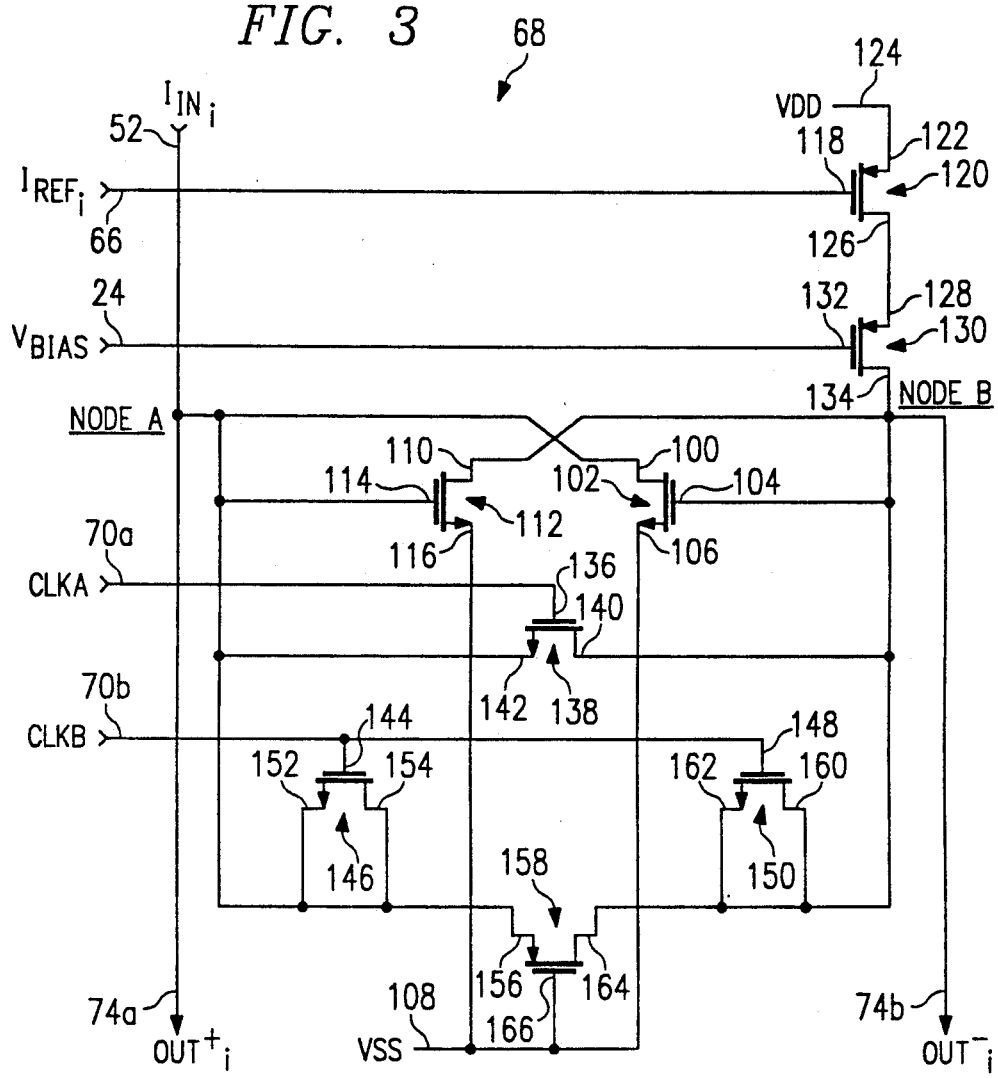
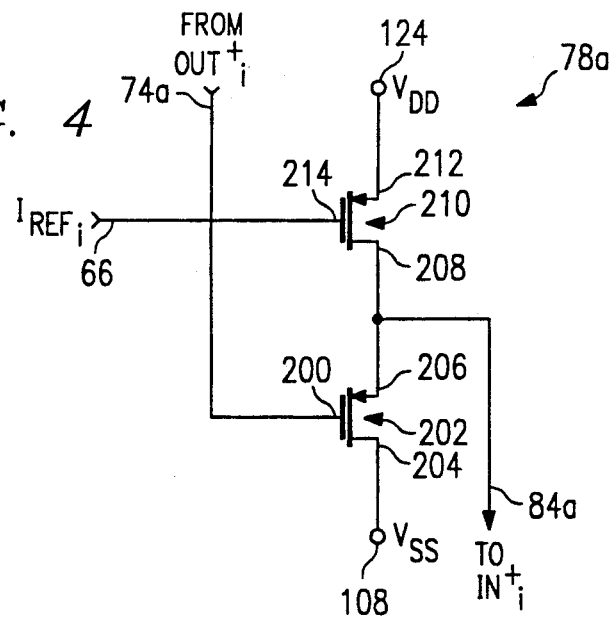

CIRCUITRY AND METHOD FOR CURRENT INPUT ANALOG TO DIGITAL CONVERSION

CROSS-REFERENCE TO RELATED APPLICATIONS

This application is related to U.S. patent application Ser. No. 07/811,488, filed concurrently herewith, entitled "Circuitry and Method for Sense Amplification".

TECHNICAL FIELD OF THE INVENTION

This invention relates in general to electronic circuitry, and in particular to a method and circuitry for current input analog to digital conversion.

BACKGROUND OF THE INVENTION

Current mode circuitry has significant advantages over voltage mode circuitry. The maximum current level for an electronic circuit is not fundamentally limited by the circuit's power supply voltage, but instead is limited only by power dissipation and component size. This advantage is significant for sub-micron processes having low supply voltage limits. Also, current signals are less subject to negative influences, such as ground and power supply noise, debiasing, and signal line impedance. Due to physical limitations of packaging and interconnection technology, these negative influences are further increased at higher operating frequencies, thus making current mode circuitry preferred for many high speed operations.

In interfacing with off-chip circuitry, standard integrated circuit ("IC") packaging uses metal lead frames to which the chip is attached and the leads are bonded. Parasitic inductances of these lead frames create large voltage differences from charging or impulsive currents, thereby negatively impacting high speed IC interfaces with voltage mode signals. Comparatively, such problems are substantially avoided for IC interfaces with current input signals from a high impedance source.

Moreover, several current mode functions do not require linear settling active gain components such as operational amplifiers, and many current mode operations incorporate low gain open loop signal processing techniques to avoid significant node voltage changes and bandwidth limitations of high gain feedback loops. Additionally, transconductance-C, MOSFET-C and other integrated continuous time filtering technologies may be configured for current output, offering favorable performance for signal bandwidths in the megahertz ("MHz") frequency range.

Current input analog to digital ("A/D") converters may be directly interfaced to switched current filters, current conveyors, and other current mode circuitry, thereby providing very high speed, supply noise rejection, and relief from package inductance problems. Moreover, high speed current input A/D converters complement the functions of commercially available high speed current steering digital to analog ("D/A") converters.

Previous approaches to current input A/D conversion typically fail to incorporate a parallel input or flash type architecture, in which a single comparator stage converts all digital bits in parallel. Instead, these previous approaches commonly use successive approximation techniques, in which a series of D/A current levels are successively compared against a current input to achieve recirculated bit operations. For example, a 10-bit resolution converter requires 10 successive current signal comparisons, effectively limiting the speed of such a successive approximation technique to a tenth of the speed possible with a parallel input architecture. For a successive approximation technique using recirculated bit operations, a typical 10-bit resolution converter provides 25 KHz sample rates. Even when a successive approximation technique is implemented to achieve cascaded or pipelined bit operations at the shortcoming of latency and additional hardware, a typical 6-bit resolution converter provides 200 Khz sample rates. Nevertheless, higher speeds are desirable; for example, integrated circuits in video applications may switch between pixels at frequencies from 10 MHz to greater than 100 MHz.

Some hybrid A/D conversion techniques combine current mode techniques with voltage mode techniques to achieve 10-bit resolution with sample rates from 20 MHz to 75 MHz and possibly higher. Nevertheless, many hybrid techniques are undesirably complex, because they require conversions between current and voltage modes during the A/D conversion process. Consequently, a complete current mode technique is desirable, such that conversions between current and voltage modes are not required.

Thus, a need has arisen for a method and circuitry for current input analog to digital conversion, such that potential advantages of current mode circuitry may be achieved. Moreover, it is desirable to provide higher sample rates for current input A/D conversion relative to typical previous approaches, and to use parallel input architecture for current input A/D conversion. Finally, a need has arisen for analog to digital conversion wherein conversions between current and voltage modes are not required.

SUMMARY OF THE INVENTION

In a method and circuitry for current input analog to digital conversion, a current input is conducted through an input path. The current input is directed through a plurality of current paths. A current through each current path is compared against an associated reference current, and a respective output signal indicative thereof is output, such that the respective output signals are indicative of a magnitude of the current input.

It is a technical advantage of the present invention that potential advantages of current mode circuitry may be achieved.

It is a further technical advantage of the present invention that higher sample rates for current input A/D conversion are possible relative to typical previous approaches.

It is another technical advantage of the present invention that parallel input architecture is used for current input A/D conversion.

It is yet another technical advantage of the present invention that conversions between current and voltage modes are not required.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 illustrates comparison circuitry of the output circuitry of the preferred embodiment;

FIG. 4 illustrates buffer circuitry of the output circuitry of the preferred embodiment;

DETAILED DESCRIPTION OF THE INVENTION

The preferred embodiment of the present invention and its advantages are best understood by referring to FIGS. 1 through 13 of the drawings, like numerals being used for like and corresponding parts of the various drawings.

Figure 1:
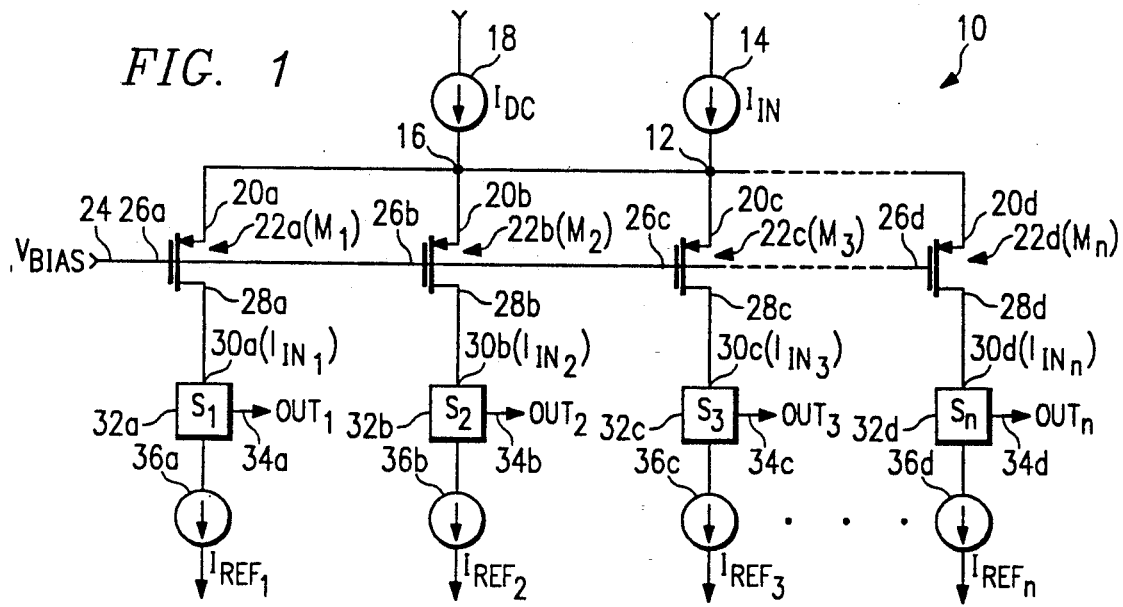
FIG. 1 illustrates circuitry for current input analog to digital conversion of the preferred embodiment.

FIG. 1 illustrates circuitry 10 for current input analog to digital conversion of the preferred embodiment. An input current path node 12 is coupled to an input current source 14 and to a DC current node 16. DC current node 16 is coupled to a DC current source 18. Input current path node 12 is further coupled to a source 20a of a p-channel transistor 22a (direction transistor $M_1$), to a source 20b of a p-channel transistor 22b (direction transistor $M_2$), to a source 20c of a p-channel transistor 22c (direction transistor $M_3$), and to a source 20d of a p-channel transistor 22d (direction transistor $M_n$). A bias voltage 24 is coupled to a gate 26a of transistor $M_1$, to a gate 26b of transistor $M_2$, to a gate 26c of transistor $M_3$, and to a gate 26d of transistor $M_n$.

A drain 28a of transistor $M_1$ is coupled to an input current path node 30a ($I_{IN1}$) of an output circuitry 32a ($S_1$). A drain 28b of transistor $M_2$ is coupled to an input current path node 30b ($I_{IN2}$) of an output circuitry 32b ($S_2$). A drain 28c of transistor $M_3$ is coupled to an input current path node 30c ($I_{IN3}$) of an output circuitry 32c ($S_3$). A drain 28d of transistor $M_n$ is coupled to an input current path node 30d ($I_{INn}$) of an output circuitry 32d ($S_n$). Output circuitry $S_1$ is coupled to an output signal 34a ($OUT_1$) and to a reference current source 36a ($I_{REF1}$). Output circuitry $S_2$ is coupled to an output signal 34b ($OUT_2$) and to a reference current source 36b ($I_{REF2}$). Output circuitry $S_3$ is coupled to an output signal 34c ($OUT_3$) and to a reference current source 36c ($I_{REF3}$). Output circuitry $S_n$ is coupled to an output signal 34d ($OUT_n$) and to a reference current source 36d ($I_{REFn}$). In the preferred embodiment, circuitry 10 is implemented in a one micron CMOS process, although other processes may be used.

In the preferred embodiment, each of transistors $M_1$-$M_n$ has a channel width of approximately 270 microns and a channel length of approximately 1 micron. In alternative embodiments, transistors $M_1$-$M_n$ may be n-channel transistors.

Transistor $M_i$ (where $i = 1 \ldots n$), output circuitry $S_i$, and reference current source $I_{REFi}$ form a module which is duplicated n times (where n is an integer value) as desired to achieve a particular bit resolution for A/D conversion circuitry 10. Digital logic values are provided by circuitry 10 on output signals $OUT_1$-$OUT_n$ based upon a variable level of current through input current source 14. Optional DC current source 18 supplies a substantially constant level of current to DC current node 16, thereby ensuring a minimum level of current through direction transistors $M_1$-$M_n$ in order to decrease a time for circuitry 10 to respond to a change in a current through input current source 14, particularly when current through input current source 14 is small.

By decreasing a time for circuitry 10 to respond to a change in current through input current source 14, circuitry 10 may sample changes in current through input current source 14 at a higher frequency. Thus, current from input current source 14 is combined with current from DC current source 18, and the total combined current from input current source 14 and DC current source 18 is supplied to direction transistors $M_1$-$M_n$. Direction transistors $M_1$-$M_n$ split the total combined current from input current source 14 and DC current source 18 into n equal parts which are respectively directed to input current path nodes $I_{IN1}$-$I_{INn}$. In the preferred embodiment, direction transistors $M_1$-$M_n$ are carefully matched to achieve desired current division ratios. Output circuitry $S_i$ compares current through input current path node $I_{INi}$ against current through reference current source $I_{REFi}$.

If current through input current path node $I_{INi}$ is greater than current through reference current source $I_{REFi}$, then output signal $OUT_i$ is a logic "1". If current through input path current path node $I_{INi}$ is less than current through reference current source $I_{REFi}$, then output signal $OUT_i$ is a logic "0".

For example, if a 4-bit resolution is desired, then $n = (2^4) - 1 = 15$. Output signals $OUT_1$-$OUT_n$ form a digital thermometer code output of A/D conversion circuitry 10. Table 1 lists thermometer codes output by circuitry 10 when $n = 15$.

TABLE 1

| 4-BIT THERMOMETER CODES ($n = 2^{\text{no. bits resolution}} - 1$) | | |
|---|---|---|
| Logic One | Logic Zero | Digital Value |
| $OUT_1$-$OUT_{15}$ | none | 15 |
| $OUT_1$-$OUT_{14}$ | $OUT_{15}$ | 14 |
| $OUT_1$-$OUT_{13}$ | $OUT_{14}$-$OUT_{15}$ | 13 |
| $OUT_1$-$OUT_{12}$ | $OUT_{13}$-$OUT_{15}$ | 12 |
| $OUT_1$-$OUT_{11}$ | $OUT_{12}$-$OUT_{15}$ | 11 |
| $OUT_1$-$OUT_{10}$ | $OUT_{11}$-$OUT_{15}$ | 10 |
| $OUT_1$-$OUT_9$ | $OUT_{10}$-$OUT_{15}$ | 9 |
| $OUT_1$-$OUT_8$ | $OUT_9$-$OUT_{15}$ | 8 |
| $OUT_1$-$OUT_7$ | $OUT_8$-$OUT_{15}$ | 7 |
| $OUT_1$-$OUT_6$ | $OUT_7$-$OUT_{15}$ | 6 |
| $OUT_1$-$OUT_5$ | $OUT_6$-$OUT_{15}$ | 5 |
| $OUT_1$-$OUT_4$ | $OUT_5$-$OUT_{15}$ | 4 |
| $OUT_1$-$OUT_3$ | $OUT_4$-$OUT_{15}$ | 3 |
| $OUT_1$-$OUT_2$ | $OUT_3$-$OUT_{15}$ | 2 |
| $OUT_1$ | $OUT_2$-$OUT_{15}$ | 1 |

TABLE 1-continued

4-BIT THERMOMETER CODES
$(n = 2^{\text{no. bits resolution}} - 1)$

| Logic One | Logic Zero | Digital Value |
|---|---|---|
| none | OUT$_1$-OUT$_{15}$ | 0 |

Thermometer codes provided by circuitry 10 on output signals OUT$_1$-OUT$_n$ may be subsequently encoded into any of several bit code formats, including binary code, gray code, and two's complement code.

In addition to comparing current through input current path node I$_{INi}$ against current through reference current source I$_{REFi}$, output circuitry S$_i$ (where i=1...n) also assists in keeping direction transistor M$_i$ and reference current source I$_{REFi}$ from entering triode, ohmic, resistive or reverse conduction states. This is because output circuitry S$_i$ sinks current from input current path node I$_{INi}$ if current through input current path node I$_{NIi}$ is greater than current through reference current source I$_{REFi}$. Moreover, output circuitry S$_i$ sources current to reference current source I$_{REFi}$ if current through input current path node I$_{INi}$ is less than current through reference current source I$_{REFi}$. The current splitting and division function of direction transistors M$_1$-M$_n$ would be negatively impacted if any of direction transistors M$_1$-M$_n$ or reference current sources I$_{REF1}$-I$_{REFn}$ entered a triode, ohmic, resistive, or reverse conduction state.

In the preferred embodiment, the currents through reference current sources I$_{REF1}$-I$_{REFn}$ are established at levels appropriate for circuitry 10 to provide linearly scaled thermometer codes on output signals OUT$_i$-OUT$_n$. Thus, the currents through current sources I$_{REF1}$-I$_{REFn}$ are given by $$I_{REFi} = \left[ I_{DC} + \left( \max. I_{IN} \times \frac{i}{2^{\text{no. bits resolution}}} \right) \right] \times \frac{1}{n}$$

where n=$2^{\text{no. bits resolution}}$-1, where i=(1...n), and where max.I$_{IN}$ is the maximum scaled value of current through input current source I$_{IN}$. Consequently, for a 4-bit resolution thermometer code as shown in TABLE 1, OUT$_1$ is a logic "1" if current through input current source I$_{IN}$ is greater than 1/16 of its maximum scaled value (max.I$_{IN}$), because current through input current path node I$_{IN1}$ is greater than current through I$_{REF1}$. Similarly, each of output signals OUT$_1$-OUT$_{12}$ is a logic "1" if current through input current source I$_{IN}$ is greater than 12/16 of its maximum scaled value (max.I$_{IN}$). In alternative embodiments, the currents through I$_{REF1}$-I$_{REFn}$ may be adjusted as desired for circuitry 10 to provide non-linearly scaled thermometer codes on output signals OUT$_1$-OUT$_n$. For example, circuitry 10 may provide logarithmically scaled thermometer codes on output signals OUT1-OUT$_n$ when appropriate levels of current are established through reference current sources I$_{REF1}$-I$_{REFn}$.

In an important aspect of the preferred embodiment, current input analog to digital conversion is achieved in a parallel architecture, such that output signals I$_{REF1}$-I$_{REFn}$ are simultaneously generated. Bias voltage 24 is set to a level appropriate to ensure that direction transistors M$_1$-M$_n$ are saturated during operation, such that bias voltage 24 is approximately 2.5 volts in the preferred embodiment. Also, in the preferred embodiment, a maximum level of current through input current source 14 is approximately ten milliamps for a 4-bit resolution A/D conversion, and current through DC current source 18 is approximately 315 microamps.

Figure 2:
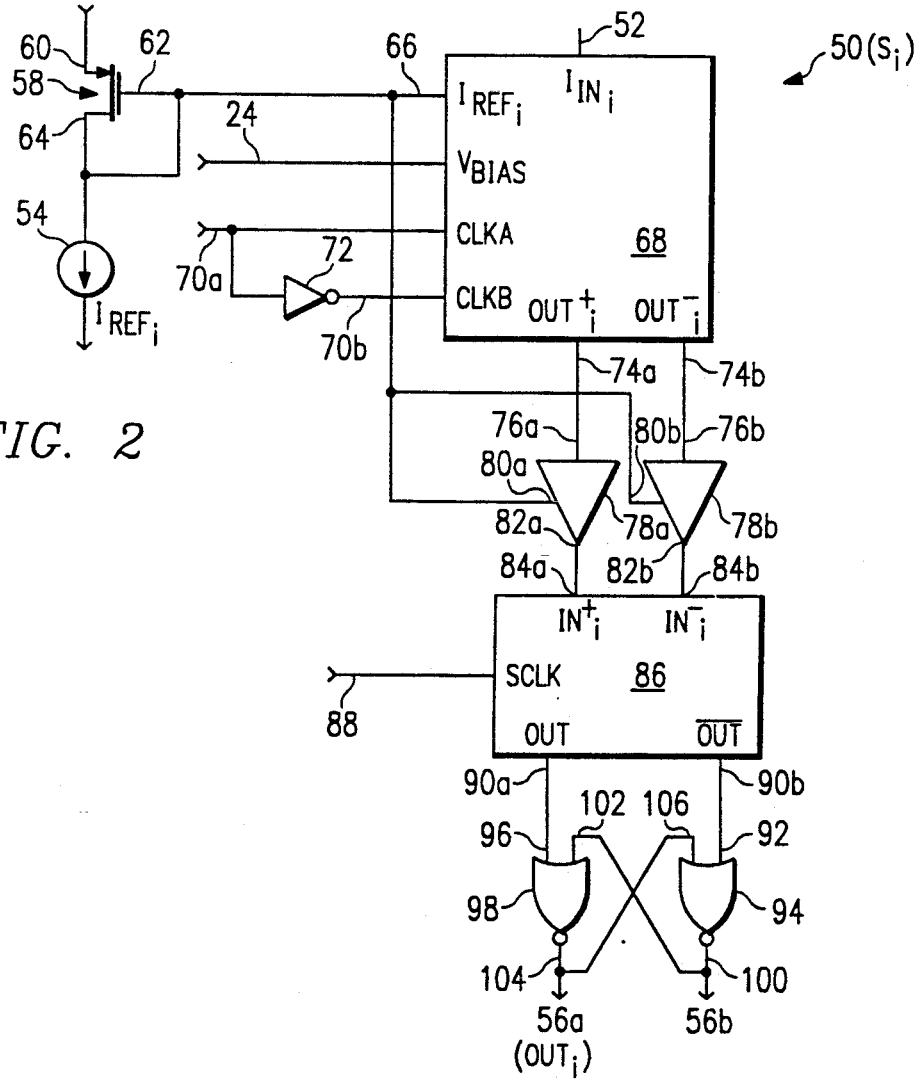
FIG. 2 illustrates output circuitry of the preferred embodiment.

FIG. 2 illustrates output circuitry 50 (S$_i$) of the preferred embodiment (where i=1...n); thus, output circuitry S$_i$ comprises circuitry which is included in each of output circuitry S$_1$, S$_2$, S$_3$ or S$_n$ shown in FIG. 1, only one of Which is shown for brevity. Input current path node 52 (I$_{INi}$) may be any one of input current path nodes I$_{REF1}$-I$_{REFn}$ shown in FIG. 1. Reference current source 54 (I$_{REFi}$) may be any one of reference current sources I$_{REF1}$-I$_{REFn}$ shown in FIG. 1. Non-inverted output signal 56a (OUT$_i$) may be any one of output signals OUT$_1$-OUT$_n$ shown in FIG. 1. An inverted output signal 56b is also provided by output circuitry 50 (S$_i$). A p-channel current mirror transistor 58 has a source 60, a gate 62, and a drain 64. Gate 62 and drain 64 are both coupled to reference current source 54 (I$_{REFi}$), which is further coupled to a reference current input 66 of a comparison circuitry 68. Comparison circuitry 68 is coupled to bias voltage 24 shown in FIG. 1. Comparison circuitry 68 is further coupled to a clock input 70a (ClkA), which is coupled to an input of an inverter 72. An output of inverter 72 is coupled to an inverted clock input 70b (ClkB) of comparison circuitry 68. Comparison circuitry 68 is further coupled to input current path node 52 (I$_{INi}$). A positive output signal 74a (OUT$_i$+) of comparison circuitry 68 is coupled to an input 76a of buffer circuitry 78a, and a negative output signal 74b (OUT$_i$-) of comparison circuitry 68 is coupled to an input 76b of buffer circuitry 78b.

Reference current input 66 of comparison circuitry 68 is coupled to an input 80a of buffer circuitry 78b and to an input 80b of buffer circuitry 78b. An output 82a of buffer circuitry 78b is coupled to a positive signal input 84a (IN$_i$+) of a sense amplification circuitry 86, and an output 82b of buffer circuitry 78b is coupled to a negative signal input 84b (IN$_i$-) of sense amplification circuitry 86. Sense amplification circuitry 86 is coupled to a sense amplifier clock signal 88. An inverted output signal 90b of sense amplification circuitry 86 is coupled to a first input 92 of a NOR gate 94, and a non-inverted output signal 90a of sense amplification circuitry 86 is coupled to a first input 96 of a NOR gate 98.

An output 100 of NOR gate 94 forms inverted output signal 56b of output circuitry 50 (S$_i$), and output 100 is coupled to a second input 102 of NOR gate 98. Output 104 of NOR gate 98 forms non-inverted output signal 56a (OUT$_i$) of output circuitry 50 (S$_i$), and output 104 is coupled to a second input 106 of NOR gate 94.

In the preferred embodiment, current mirror transistor 58 and reference current source I$_{REFi}$ are shared by all output circuitry S$_1$-S$_n$, and each output circuitry S$_1$-S$_n$ individually forms its own scaled current mirror with current mirror transistor 58 as appropriate to achieve a desired thermometer code scale, as for example by individually setting channel dimensions of a corresponding current mirror transistor within each output circuitry S$_1$-S$_n$. Comparison circuitry 68 compares current through input current path node I$_{INi}$ against a current through such a corresponding current mirror transistor within comparison circuitry 68, as described further hereinbelow in connection with FIG. 3.

Alternatively, each output circuitry S$_1$-S$_n$ may have its own reference current source I$_{REFi}$ and current mirror transistor 58. After comparison circuitry 68 develops a differential voltage between output signals 74a (OUT$_i$+) and 74b (OUT$_i$−), the current input analog to digital conversion process is substantially complete, and several different approaches may be used to implement the functions of buffer circuitry 78a-b and sense amplification circuitry 86 of FIG. 2.

In the preferred embodiment, buffer circuitry 78b and 78b are unity gain buffers, but they may alternatively be amplification buffers. Buffer circuitry 78b and 78b substantially protect comparison circuitry 68 against high speed transients in sense amplifier circuitry 86.

Sense amplification circuitry 86 amplifies differential output signals OUT$_i$+ and OUT$_i$− to digital signal levels at output signals 90a-b. In the preferred embodiment, sense amplifier clock signal 88 is coupled to inverted clock input 70b (ClkB), such that sense amplification circuitry 86 amplifies and latches output signals OUT$_i$+ and OUT$_i$− on positive edge transitions of clock input 70a (ClkA) when comparison circuitry 68 resets output signals OUT$_i$+ and OUT$_i$−. NOR gates 98 and 94 latch output signals 90a-b from sense amplification circuitry 86, such that the digital value of non-inverted output signal 90a is latched at non-inverted output signal 56a (OUT$_i$) and such that inverted output signal 90b is latched at inverted output signal 56b.

FIG. 3 illustrates schematic detail of the comparison circuitry 50 (S$_i$) of the preferred embodiment. Input current path node 52 (I$_{INi}$) is coupled to positive output signal 74a (OUT$_i$+) at Node A. Node A is coupled to a drain 100 of an n-channel regeneration transistor 102. A gate 104 of regeneration transistor 102 is coupled to Node B. A source 106 of regeneration transistor 102 is coupled to a V$_{ss}$ 108. Node B is coupled to a drain 110 of an n-channel regeneration transistor 112. A gate 114 of regeneration transistor 112 is coupled to Node A. A source 116 of regeneration transistor 112 is coupled to V$_{ss}$ 108.

Reference current input 66 (I$_{REFi}$) is coupled to a gate 118 of a p-channel current mirror transistor 120 corresponding to current mirror transistor 58 of FIG. 2. A source 122 of current mirror transistor 120 is coupled to a V$_{dd}$ 124. A drain 126 of current mirror transistor 120 is coupled to a source 128 of a p-channel balance transistor 130. A gate 132 of balance transistor 130 is coupled to bias voltage 24. A drain 134 of balance transistor 130 is coupled to negative output signal 74b (OUT$_i$−) at Node B. A gate 136 of an n-channel reset transistor 138 is coupled to clock input 70a (ClkA). A drain 140 of reset transistor 138 is coupled to Node B.

A source 142 of reset transistor 138 is coupled to Node A. A gate 144 of an n-channel capacitance transistor 146 is coupled to inverted clock input 70b (ClkB) and to a gate 148 of an n-channel capacitance transistor 150. A source 152 of capacitance transistor 146 is coupled to Node A, to a drain 154 of capacitance transistor 146, and to a source 156 of a p-channel equalization transistor 158. A drain 160 of capacitance transistor 150 is coupled to Node B, to a source 162 of capacitance transistor 150, and to a drain 164 of equalization transistor 158. A gate 166 of equalization transistor 158 is coupled to V$_{ss}$ 108.

In the preferred embodiment, balance transistor 130 has a channel length of approximately 1 micron and a channel width of approximately 270 microns. Regeneration transistors 112 and 102 each have a channel length of approximately 1 micron and a channel width of approximately 150 microns. Reset transistor 138 has a channel length of approximately 1 micron and a channel width of approximately 30 microns. Capacitance transistors 146 and 150 each have a channel length of approximately 1 micron and a channel width of approximately 35 microns. Equalization transistor 158 has a channel length of approximately 1 micron and a channel width of approximately 150 microns.

Current mirror transistor 120 has channel dimensions which may vary according to the particular output circuitry S$_1$-S$_n$ in which current mirror transistor 120 is located, in order to achieve a desired thermometer code as described further hereinabove in connection with FIG. 1. Comparison circuitry 68 is balanced, in that output signals OUT$_i$+ and OUT$_i$− are each coupled to equivalent circuitry. For example, current through current sources I$_{IN}$ and I$_{DC}$ of FIG. 1 balances current through drain 126 of current mirror transistor 120, balance transistor 130 of FIG. 3 balances direction transistor M$_i$ of FIG. 1, regeneration transistor 112 balances regeneration transistor 102, capacitance transistor 146 balances capacitance transistor 150, and Node A balances Node B. Moreover, reset transistor 138 and equalization transistor 158 are symmetrically coupled between Node A and Node B. By being balanced, comparison circuitry 68 is more accurate, because it is less subject to negative consequences of interference from circuit switching noise which might otherwise result from imbalances in the circuit.

Preferably, the voltages at drains 28a-d of direction transistors M$_1$-M$_n$ of FIG. 1 are substantially equal during reset, so that direction transistors M$_1$-M$_n$ substantially evenly divide current from input current source I$_{IN}$ and DC current source I$_{DC}$. A substantially even division of current through direction transistors M$_1$-M$_n$ may be achieved by resetting comparison circuitry 68. Comparison circuitry 68 is reset when ClkA is high, such that reset transistor 138 has a low source to drain impedance, resulting in positive output signal OUT$_i$+ being substantially equal to negative output signal OUT$_i$−. Also, regeneration transistors 112 and 102 operate as diode-connected devices during reset and have a uniform low impedance. The low impedance path created between Node A and Node B by reset transistor 138 shortens a time otherwise necessary to reset comparison circuitry 68, such that higher sample rate frequencies of analog to digital conversion may be achieved.

After reset, clock input ClkA is low, such that reset transistor 138 has a high source to drain impedance, and such that inverted clock input ClkB is high, resulting in capacitance transistors 146 and 150 each forming a small parasitic capacitance for drawing charges away from Node A and Node B, respectively. Consequently, capacitance transistors 146 and 150 at least partially cancel negative consequences of charges resulting from reset transistor 138 turning off after reset. Moreover, capacitance transistors 146 and 150 facilitate a subsequent resetting of comparison circuitry 68 when clock input ClkA later returns to a high level, because capacitance transistors 146 and 150 resupply charges to Node A and Node B during reset.

After reset, regeneration transistors 112 and 102 may quickly develop a differential voltage between output signals 74a (OUT$_i$+) and 74b (OUT$_i$−), based upon whether current through input current path node I$_{INi}$ is greater than current through drain 134 of balance transistor 130. Current through drain 134 of balance transistor 130 is substantially equal to current through drain 126 of current mirror transistor 120.

If a current through input current path node $I_{INi}$ is greater than a current through drain 134 of balance transistor 130, then Node A moves to a higher voltage relative to Node B. If Node A has a higher voltage relative to Node B, then current through source 116 of regeneration transistor 112 is greater than current through source 106 of regeneration transistor 102, because Node A is coupled to gate 114 of regeneration transistor 112, and because Node B is coupled to gate 104 of regeneration transistor 102. If regeneration transistor 112 conducts more current than regeneration transistor 102, the voltage at Node B is further decreased relative to the voltage at Node A, thereby making regeneration transistor 112 even further conductive relative to regeneration transistor 102. Consequently, a positive feedback is provided by regeneration transistors 112 and 102, such that a differential voltage is quickly achieved between Node A and Node B after reset, responsive to a current through input current path node $I_{INi}$ being greater than a current through drain 134 of balance transistor 130.

Likewise, if a current through input current path node $I_{INi}$ is less than a current through drain 134 of balance transistor 130, then regeneration transistors 112 and 102 provide a positive feedback, such that a differential voltage is quickly achieved with Node B having a higher voltage relative to Node A. Thus, comparison circuitry 68 compares a current through input current path node $I_{INi}$ against a current through drain 134 of balance transistor 130, and quickly produces a differential voltage between output signals $OUT_i+$ (coupled to Node A) and $OUT_i-$ (coupled to Node B). Thus, positive output signal $OUT_i+$ has the higher voltage if current through input current path node $I_{INi}$ is higher than current through drain 134 of balance transistor 130. Negative output signal $OUT_i-$ has the higher voltage if current through drain 134 of balance transistor 130 is higher than current through input current path node $I_{INi}$.

The channel dimensions of reset transistor 138 are preferably selected to optimally balance the need for drains 28a–d of direction transistors $M_1$–$M_n$ to be substantially equal during reset against the need for a slight differential voltage between Node A and Node B during reset so that a differential voltage may be more quickly produced by comparison circuitry 68 after reset.

Importantly, equalization transistor 158 has a low source-to-drain impedance sufficient to substantially restrain the differential voltage between Node A and Node B from causing either direction transistor $M_i$ or balance transistor 130 to enter a triode, ohmic, resistive, or reverse conduction state after reset. Equalization transistor 158 operates symmetrically in either forward or reverse directions, based upon whether a threshold source-to-gate voltage is reached between Node A and $V_{ss}$ 108 or between Node B and $V_{ss}$ 108. Thus, if Node A has a higher voltage than Node B, then equalization transistor 158 substantially limits the extent to which voltage at Node A may exceed voltage at Node B. Similarly, if Node B has a higher voltage than Node A, then equalization transistor 158 substantially limits the extent to which voltage at Node B may exceed voltage at Node A.

By limiting the differential voltage between Node A and Node B, comparison circuitry 68 may reset more quickly in response to clock input ClkA being high, because voltages at Node A and Node B may be substantially equalized more quickly by reset transistor 138, and because neither direction transistor $M_i$ nor balance transistor 130 is forced to recover from a triode state. During reset, equalization transistor 158 has a source-to-gate voltage of approximately one volt, such that equalization transistor 158 is a partially conductive. In an alternative embodiment, the functions of equalization transistor 158 may be implemented by multiple equalization transistors. The source-to-gate voltage of equalization transistor 158 is substantially equal to the gate-to-source voltage of either regeneration transistor 112 or regeneration transistor 102.

FIG. 4 illustrates schematic detail of buffer circuitry 78b of output circuitry 50 ($S_i$) (shown in FIG. 2) of the preferred embodiment. Buffer circuitry 78b of FIG. 2 is equivalent in design to buffer circuitry 78a. In FIG. 4, positive output signal 74a ($OUT_i+$) is coupled to a gate 200 of a p-channel transistor 202. A drain 204 of p-channel transistor 202 is coupled to $V_{ss}$ 108. A source 206 of p-channel transistor 202 is coupled to positive signal input 84a ($IN_i+$) (shown in FIG. 2) and to a drain 208 of a p-channel transistor 210. A source 212 of p-channel transistor 210 is coupled to $V_{DD}$ 124. A gate 214 of p-channel transistor 210 is coupled to reference current input 66 (shown in FIG. 2). In the preferred embodiment, transistor 210 has a channel length of approximately five microns and a channel width of approximately 30 microns, and transistor 202 has a channel length of approximately one micron and a channel width of approximately 10 microns.

In operation, transistor 210 forms a current mirror with current mirror transistor 58 of FIG. 2, such that transistor 210 supplies substantially constant current through drain 208. Positive output signal $OUT_i+$ controls a voltage level at positive signal input $IN_i+$ by controlling the extent to which transistor 202 sinks current from drain 208 of transistor 210. If positive output signal $OUT_i+$ has a relatively low voltage, then transistor 202 sinks a relatively large amount of current from drain 208 of transistor 210, such that positive signal input $IN_i+$ also has a relatively low voltage. If positive output signal $OUT_i+$ has a relatively high voltage, then transistor 202 sinks a relatively small amount of current from drain 208 of transistor 210, such that positive signal input $IN_i+$ also has a relatively high voltage. Consequently, a voltage at positive signal input $IN_i+$ is approximately equal to a voltage at positive output signal $OUT_i+$ increased by a source-to-gate voltage of transistor 202. In this manner, buffer circuitry 78a substantially isolates comparison circuitry 68 of FIG. 2 against negative consequences of signal noise from sense amplifier circuitry 86 of FIG. 2.

Figure 5:
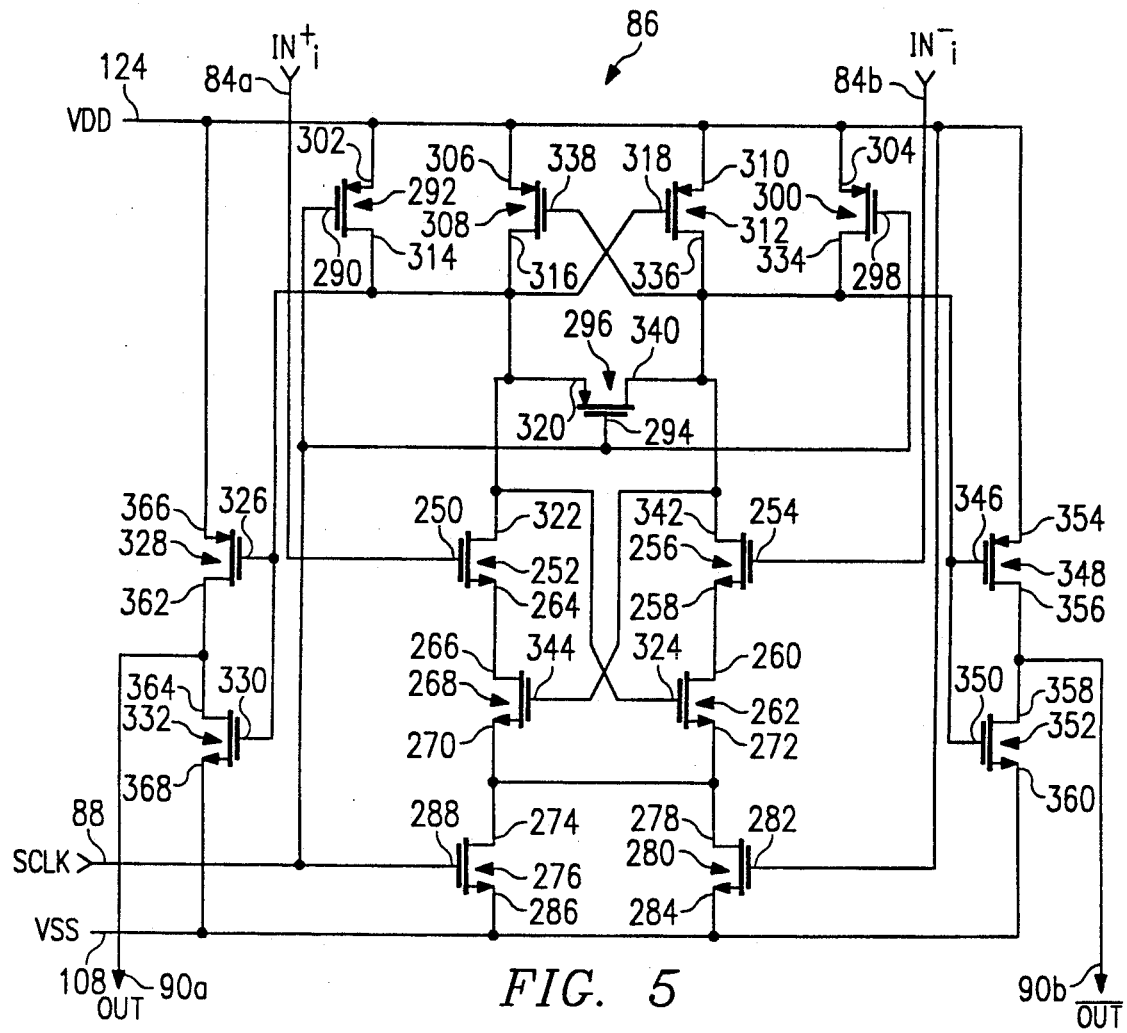
FIG. 5 illustrates sense amplification circuitry of the output circuitry of the preferred embodiment.

FIG. 5 illustrates sense amplification circuitry 86 of output circuitry 50 ($S_i$) (shown in FIG. 2) of the preferred embodiment. Sense amplification circuitry 86 of the preferred embodiment may be advantageously applied to any system in order to quickly and reliably amplify differential voltage signals. Positive signal input 84a ($IN_i+$) is coupled to a gate 250 of an n-channel input transistor 252. Negative input signal 84b ($IN_i-$) is coupled to a gate 254 of an n-channel input transistor 256. A source 258 of transistor 256 is coupled to a drain 260 of an n-channel transistor 262. A source 264 of transistor 252 is coupled to a drain 266 of an n-channel transistor 268.

A source 270 of transistor 268 is coupled to a source 272 of transistor 262, to a drain 274 of an n-channel transistor 276, and to a drain 278 of an n-channel transistor 280. A gate 282 of transistor 280 is coupled to $V_{DD}$ 124. A source 284 of transistor 280 is coupled to $V_{ss}$ 108. A source 286 of transistor 276 is coupled to $V_{ss}$ 108. A gate 288 of transistor 276 is coupled to sense amplifier clock signal 88 (SClk), which is further coupled to a gate 290 of a p-channel transistor 292, to a gate 294 of a p-channel transistor 296, and to a gate 298 of a p-channel transistor 300. A source 302 of transistor 292 is coupled to $V_{DD}$ 124.

A source 304 of transistor 300 is coupled to $V_{DD}$ 124. A source 306 of a p-channel transistor 308 is coupled to a $V_{DD}$ 124. A source 310 of a p-channel transistor 312 is coupled to $V_{DD}$ 124. A drain 314 of transistor 292 is coupled to a drain 316 of transistor 308, to a gate 318 of transistor 312, to a source 320 of transistor 296, to a drain 322 of transistor 252, to a gate 324 of transistor 262, to a gate 326 of a p-channel transistor 328, and to a gate 330 of an n-channel transistor 332. A drain 334 of transistor 300 is coupled to a drain 336 of transistor 312, to a gate 338 of transistor 308, to a drain 340 of transistor 296, to a drain 342 of transistor 256, to a gate 344 of transistor 268, to a gate 346 of a p-channel transistor 348, and to a gate 350 of an n-channel transistor 352. A source 354 of transistor 348 is coupled to $V_{DD}$ 124. A drain 356 of transistor 348 is coupled to a drain 358 of transistor 352 and to inverted output signal 90b ($\overline{OUT}$). A source 360 of transistor 352 is coupled to $V_{ss}$ 108. A drain 362 of transistor 328 is coupled to non-inverted output signal 90a (OUT) and to a drain 364 of transistor 332. A source 366 of transistor 328 is coupled to $V_{DD}$ 124. A source 368 of transistor 332 is coupled to $V_{ss}$ 108.

In the preferred embodiment, transistor 328 has a channel length of approximately 1 micron and a channel width of approximately 5 microns. Transistor 332 has a channel length of approximately 1 micron and a channel width of approximately 3 microns. Transistor 292 has a channel length of approximately 1 micron and a channel width of approximately 12 microns. Transistor 308 has a channel length of approximately 1 micron and channel width of approximately 4 microns. Transistor 252 has a channel length of approximately 1 micron and a channel width of approximately 40 microns. Transistor 268 has a channel length of approximately 1 micron and a channel width of approximately 7 microns. Transistor 276 has a channel length of approximately 1 micron and a channel width of approximately 18 microns. Transistor 312 has a channel length of approximately 1 micron and a channel width of approximately 4 microns. Transistor 256 has a channel length of approximately 1 micron and a channel width of approximately 40 microns. Transistor 262 has a channel length of approximately 1 micron and a channel width of approximately 7 microns. Transistor 280 has a channel length of approximately 1 micron and a channel width of approximately 2.6 microns. Transistor 348 has a channel length of approximately 1 micron and a channel width of approximately 5 microns. Transistor 352 has a channel length of approximately 1 micron and a channel width of approximately 3 microns. Transistor 296 has a channel length of approximately 1 micron and a channel width of approximately 4 microns.

Transistors 328 and 332 together form a CMOS inverter, such that output signal 90a (OUT) has a digital logic voltage inverted from a digital logic voltage at gate 326 of transistor 328. Transistors 348 and 352 together from a CMOS inverter, such that inverted output signal 90b ($\overline{OUT}$) has a digital logic voltage inverted from a digital logic voltage at gage 346 of transistor 348.

During reset, sense amplifier clock signal 88 (SClk) is low, such that transistors 292, 296, and 300 each has a low impedance, resulting in a voltage at gate 326 of transistor 328 being substantially equal to a voltage at $V_{DD}$ 124, and further resulting in a voltage at gate 346 of transistor 348 being substantially equal to a voltage at $V_{DD}$ 124. During reset, transistor 296 assists in maintaining a voltage at output signal 90a (OUT) which is substantially equal to a voltage at output signal 90b ($\overline{OUT}$). Transistors 268 and 262 operate in a triode state during reset, thereby functioning as resistors.

In an important aspect of the preferred embodiment, during reset, positive signal input $IN_i^+$ controls an impedance level of transistor 252, and negative signal input $IN_i^-$ controls an impedance level of transistor 256. If an impedance level of transistor 252 is higher than an impedance level of transistor 245, then drain 322 of transistor 252 will tend toward a higher voltage than drain 342 of transistor 256. Thus, transistor 268 has a higher impedance than transistor 262, and transistor 308 has a lower impedance than transistor 312. Transistor 280 provides bias current through source 270 of transistor 268 and through source 272 of transistor 262, in order to assist the development of a differential voltage between drain 322 of transistor 252 and drain 342 of transistor 256. Thus, a positive feedback is created, so that sense amplifier circuitry 86 may quickly amplify a voltage differential between signal inputs $IN_i^+$ and $IN_i^-$, resulting in an amplified differential voltage provided at output signals 90a (OUT) and 90b ($\overline{OUT}$).

Nevertheless, during reset, the bias current through transistor 280 is sufficiently small, so that the low impedances of transistors 292, 296, and 300 may successfully minimize a voltage differential between output signals 90a (OUT) and 90b ($\overline{OUT}$), with both output signals 90a (OUT) and 90b ($\overline{OUT}$) having a voltage near $V_{ss}$ 108. It is a technical advantage that, despite the dominance of transistors 292, 296, and 300 over output signals 90a (OUT) and 90b ($\overline{OUT}$) during reset, transistors 308, 312, 252, 256, 268, 262 and 280 are properly biased during reset, so that a high speed transition of output signals 90a (OUT) and 90b ($\overline{OUT}$) may be achieved immediately after reset.

Moreover, by properly biasing transistors 308, 312, 252, 256, 268, 262 and 280 during reset, only a small voltage differential is required between signal inputs $IN_i^+$ and $IN_i^-$ in order to achieve a specified amplification speed and reliability of digital logic values at output signals 90a (OUT) and 90b ($\overline{OUT}$), in response to changes in signal inputs $IN_i^+$ and $IN_i^-$. Similarly, the specified amplification speed and reliability may be achieved with relatively low power, because sense amplification circuitry 86 advantageously uses the time during reset to properly bias transistors 308, 312, 252, 256, 268, 262, and 280, so that less power is required after reset to achieve the desired sense amplification within a specified time period. For example, sense amplification circuitry 86 achieves a specified amplification speed and reliability of digital logic values at output signals 90a (OUT) and 90b ($\overline{OUT}$) when a voltage differential between signal inputs $IN_i^+$ and $IN_i^-$ is at least 5-10 mV. This operation is substantially improved over typical previous approaches requiring a voltage differential between signal inputs $IN_i^+$ and $IN_i^-$ of approximately 50 mV to achieve the same specified amplification speed and reliability.

After reset, sense amplifier clock signal 88 (SClk) is high, such that transistor 276 has a low impedance, and such that transistors 292, 296, and 300 each have a high impedance. Consequently, by substantially removing the effects of transistors 292, 296, and 300 on maintaining substantially equal voltages at output signals 90a (OUT) and 90b ($\overline{\text{OUT}}$) near the voltage at $V_{ss}$ 180, and by turning on transistor 276 to further enhance the bias current applied to transistors 268 and 262, a fast and reliable amplification of signal inputs $IN_i$+ and $IN_i$− is achieved with relatively low power requirements. The low power requirements result because signal inputs $IN_i$+ and $IN_i$− initiate a differential voltage between drain 322 of transistor 252 and drain 342 of transistor 256 during reset.

A first CMOS inverter is formed by transistors 308 and 268, and a second CMOS inverter is formed by transistors 312 and 262; together, the first and second CMOS inverters form a back-to-back latch having a first output voltage at drain 316 of transistor 308 and a second output voltage at drain 336 of transistor 312. After reset, a polarity of the first output voltage at drain 316 relative to the second output voltage at drain 336 is inverted from the polarity of positive signal input $IN_i$+ relative to negative signal input $IN_i$−. Since the first output voltage at drain 316 is inverted by the CMOS inverter formed by transistors 328 and 332, and since the second output voltage at drain 336 is inverted by the CMOS inverter formed by transistors 348 and 352, a polarity of output signal 90a (OUT) relative to inverted output signal 90b ($\overline{\text{OUT}}$) is the same as a polarity of positive signal input $IN_i$+ relative to negative signal input $IN_i$−.

Figure 6A:
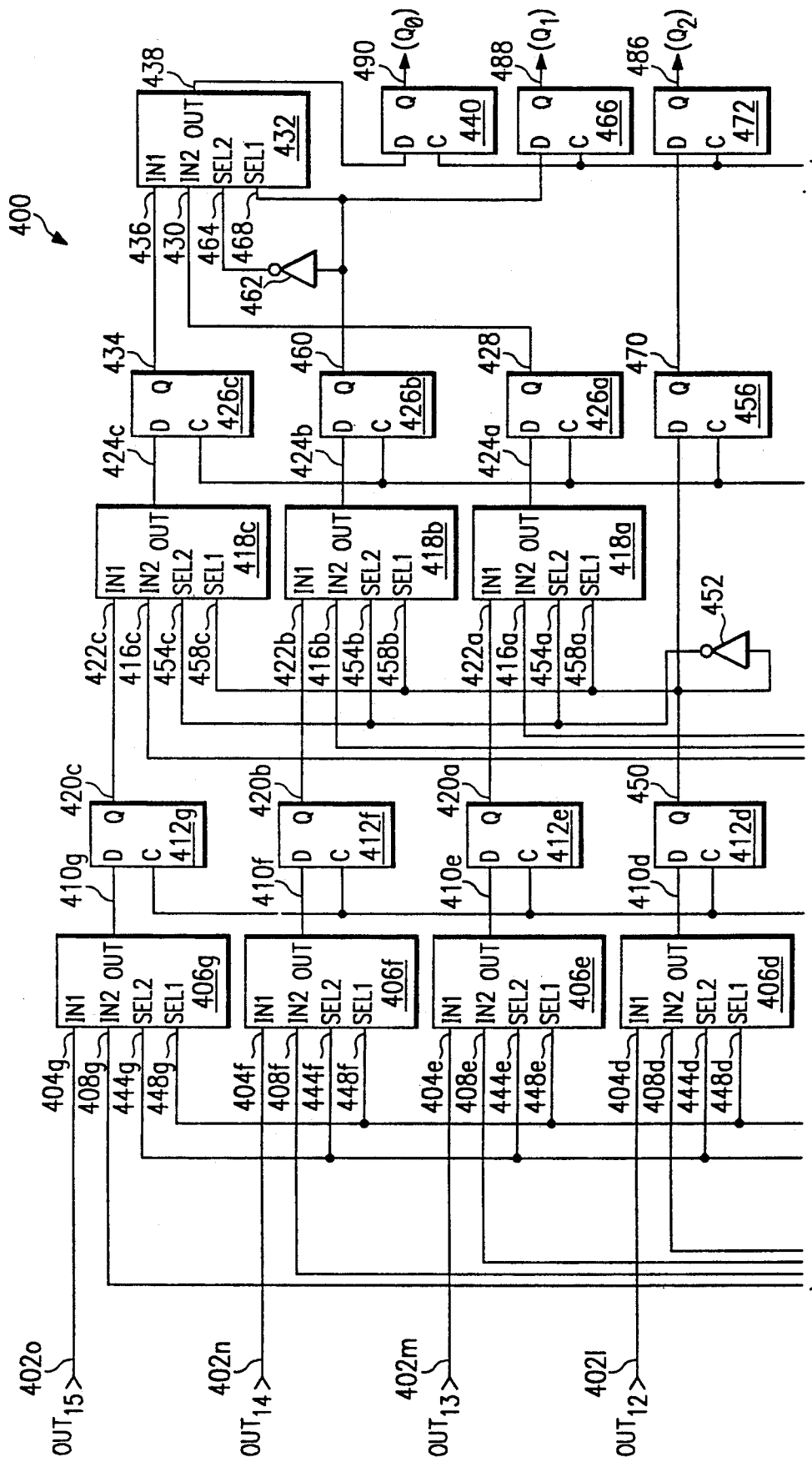
FIGS. 6a-b illustrate encoder circuitry of the preferred embodiment.
Figure 6B:
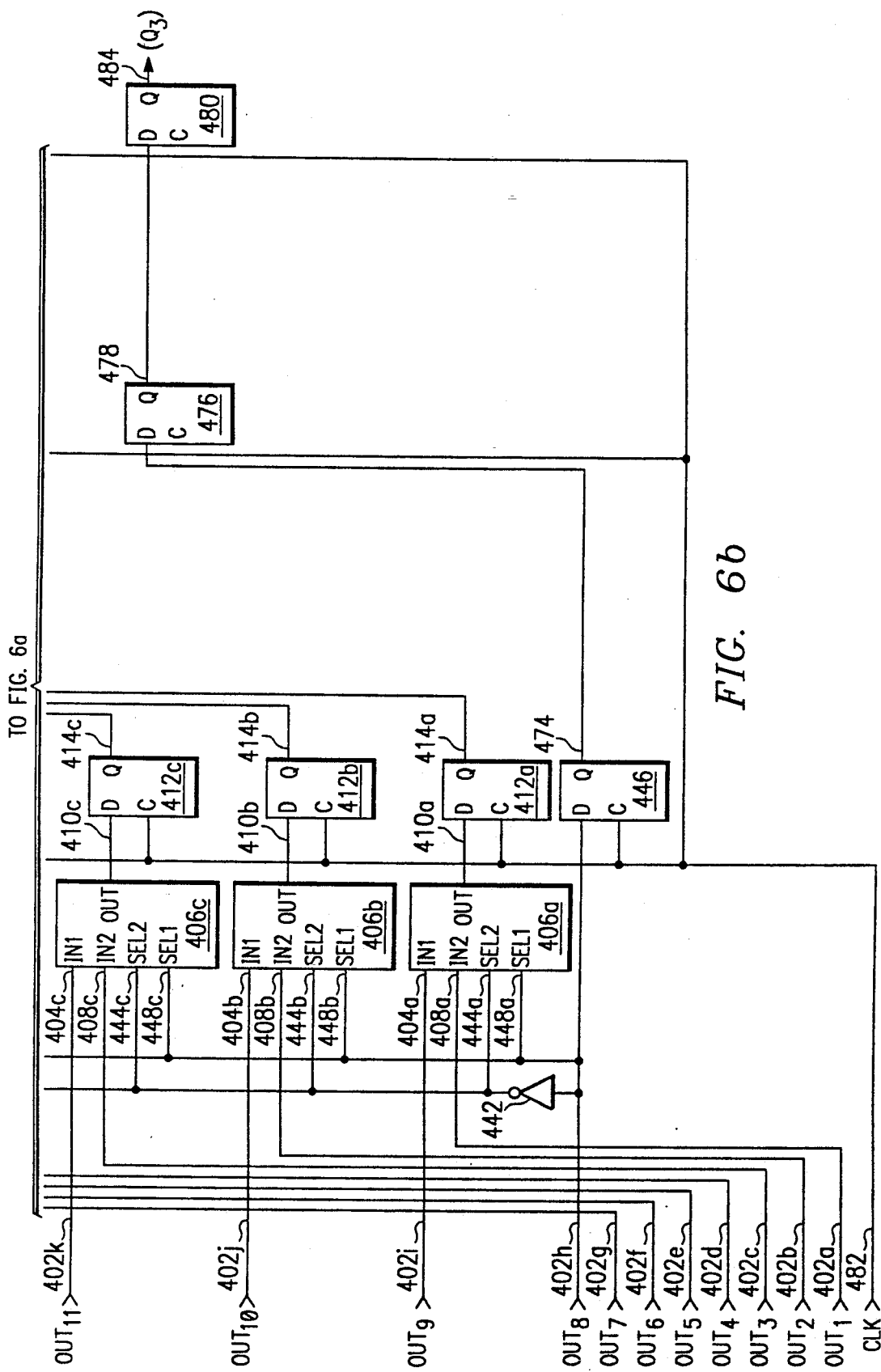

FIGS. 6a-b illustrate encoder circuitry 400 of the preferred embodiment. In an important aspect of the preferred embodiment, encoder circuitry 400 implements a binary search approach to encode parallel thermometer code output signals $OUT_1$-$OUT_n$ of circuitry 10 (FIG. 1) into a corresponding binary code output. Typical previous approaches use a look-up table stored in a read-only memory to convert from thermometer codes to corresponding binary codes. In these previous approaches, a co responding binary code is stored at an address in the read-only memory specified by a particular thermometer code. A shortcoming of such previous approaches may be revealed if an error exists in the thermometer code. A shortcoming of such previous approaches may be revealed if an error exists in the thermometer code. Such an error may occur when a particular bit of the thermometer code is a logic "1", while no immediately adjacent bit is also a logic "1".

For a 4-bit resolution thermometer code as described further hereinabove in connection with TABLE 1, such an error may occur if, for example, output signals $OUT_1$-$OUT_5$ are each correctly a logic "1", while output signal $OUT_7$ is incorrectly a logic "1". In this example, a correct digital binary code output is 0101. However, typical previous approaches using read-only memory look-up tables may fail to provide the correct digital binary code output, because the incorrect state of output signal $OUT_7$ causes an incorrect address to be specified in the read-only memory. Encoder circuitry 400 substantially avoids the negative consequences of such thermometer code errors by using a binary search approach to convert a parallel input digital thermometer code into its corresponding binary code.

Circuitry 400 of FIGS. 6a-b is shown for a 4-bit resolution parallel input digital thermometer code comprising 15 output signals $OUT_1$-$OUT_{15}$ (also shown in FIGS. 6a-b as 402a-o, respectively). Although circuitry 400 is shown for a 4-bit resolution thermometer code, it may be readily modified to accommodate thermometer codes having other bit resolutions.

In FIGS. 6a-b, output signals $OUT_9$-$OUT_{15}$ are coupled to inputs 404a-g of multiplexers 406a-g, respectively. Output signals $OUT_1$-$OUT_7$ are coupled to inputs 408a-g of multiplexers 406a-g, respectively. Outputs 410a-g of multiplexers 406a-g are coupled to inputs of D-type flip-flops 412a-g, respectively. Outputs 414a-c of flip-flops 412a-c are coupled to inputs 416a-c of multiplexers 418a-c, respectively. Outputs 420a-c of flip-flops 412e-g are coupled to inputs 422a-c of multiplexers 418a-c, respectively. Outputs 424a-c of multiplexers 418a-c are coupled to inputs of D-type flip-flops 426a-c, respectively. An output 428 of flip-flop 426a is coupled to an input 430 of a multiplexer 432. An output 434 of flip-flop 426c is coupled to an input 436 of multiplexer 432. An output 438 of multiplexer 432 is coupled to an input of a D-type flip-flop 440.

Output signal $OUT_8$ is coupled through an inverter 442 to select line inputs 444a-g of multiplexers 406a-g, respectively. Output signal $OUT_8$ is further coupled to an input of a D-type flip-flop 446 and to select line inputs 448a-g of multiplexers 406a-g, respectively. An output 450 of flip-flop 412d is coupled through an inverter 452 to select line inputs 454a-c of multiplexers 418a-c, respectively. Output 450 of flip-flop 412d is further coupled to an input of a D-type flip-flop 456 and to select line inputs 458a-c of multiplexers 418a-c, respectively. An output 460 of flip-flop 426b is coupled through an inverter 462 to a select line input 464 of multiplexer 432. Output 460 of flip-flop 426b is further coupled to an input of a D-type flip-flop 466 and to a select line input 468 of multiplexer 432. An output 470 of flip-flop 456 is coupled to an input of a D-type flip-flop 472. An output 474 of flip-flop 446 is coupled to an input of a D-type flip-flop 476. An output 478 of flip-flop 476 is coupled to an input of a D-type flip-flop 480. A clock signal 482 is coupled to clock inputs of flip-flops 412a-g, 426a-c, 440, 446, 456, 476, 466, 472 and 480.

A binary code output of circuitry 400 is formed by output 484($Q_3$) of flip-flop 480, output 486($Q_2$) of flip-flop 472, output 488($Q_1$) of flip-flop 466, and output 490 ($Q_0$) of flip-flop 440, where $Q_3$ is the most significant bit, and where $Q_0$ is the least significant bit. If output signal $OUT_8$ is a logic zero, then a digital logic value of output signals $OUT_1$-$OUT_{15}$ is less than "8". In that case, output signal $OUT_8$ disables select line inputs 448a-g of multiplexers 406a-g, respectively. Moreover, inverter 442 enables select line inputs 444a-g of multiplexers 406a-g, respectively, such that output signals $OUT_1$-$OUT_7$ are output by multiplexers 406a-g on outputs 410a-g, respectively.

Alternatively, if output signal $OUT_8$ is a logic one, then output signals $OUT_1$-$OUT_{15}$ have a digital logic value of at least "8". In that case, output signal $OUT_8$ enables select line inputs 448a-g of multiplexers 406a-g, respectively. Moreover, inverter 442 disables select line inputs 444a-g of multiplexers 406a-g, respectively, such that output signals $OUT_9$-$OUT_{15}$ are output by multiplexers 406a-g on outputs 410a-g, respectively.

On a positive edge transition of clock signal 482, outputs 410a-g of multiplexers 406a-g are latched by flip-flops 412a-g on outputs 414a-g, respectively, and output signal $OUT_8$ is latched by flip-flop 446 on output 474. If output 450 of flip-flop 412d is a logic zero, then output 450 disables select line inputs 458a-c of multiplexers 418a–c, respectively; moreover, inverter 452 enables select line inputs 454a–c of multiplexers 418a–c, respectively, such that outputs 414a–c of flip-flops 412a–c are output by multiplexers 418a–c on outputs 424a–c, respectively.

Alternatively, if output 450 of flip-flop 412d is a logic one, then output 450 enables select line inputs 458a–c of multiplexers 418a–c, respectively. Moreover, inverter 452 disables select line inputs 454a–c of multiplexers 418a–c, respectively, such that outputs 420a–c of flip-flops 412e–g are output by multiplexers 418a–c on outputs 424a–c, respectively.

On a positive edge transition of clock signal 482, outputs 424a–c of multiplexers 418a–c are latched by flip-flops 426a–c on outputs 428, 460 and 434, respectively, and output 450 of flip-flop 412d is latched by flip-flop 456 on output 470. Output 474 of flip-flop 446 is latched by flip-flop 476 on output 478.

If output 460 of flip-flop 426b is a logic zero, then output 460 disables select line input 468 of multiplexer 432. Inverter 462 enables select line input 464 of multiplexer 432, such that output 428 of flip-flop 426a is output by multiplexer 432 on output 438.

Alternatively, if output 460 of flip-flop 426b is a logic one, then output 460 enables select line input 468 of multiplexer 432. Inverter 462 disables select line input 464 of multiplexer 432, such that output 434 of flip-flop 426c is output by multiplexer 432 on output 438.

On a positive edge transition of clock signal 482, output 438 of multiplexer 432 is latched by flip-flop 440 on output 490($Q_0$), and output 460 of flip-flop 426b is latched by flip-flop 466 on output 488($Q_1$). Output 470 of flip-flop 456 is latched by flip-flop 472 on output 486($Q_2$), and output 478 of flip-flop 476 is latched by flip-flop 480 on output 484($Q_3$).

In an important aspect of the preferred embodiment, circuitry 400 converts from thermometer codes to binary codes in a pipelined manner, such that a new thermometer code may be received from output signals $OUT_1$–$OUT_{15}$ upon each positive edge transition of clock signal 482, because flip-flops 412a–g and 446 latch necessary values from an immediately preceding thermometer code. Similarly, flip-flops 426a–c, 456 and 476 latch necessary values from flip-flops 412a–g and 446, so that flip-flops 412a–g and 446 may latch new data. Moreover, flip-flops 440, 466, 472 and 480 latch necessary values from flip-flops 426a–c, 456 and 476, so that flip-flops 426a–c, 456 and 476 may latch new data. When flip-flops 440, 466, 472, and 480 latch necessary values from flip-flops 426a–c, 456 and 476, the encoding process is complete, with a binary code output provided at output signals $Q_3$, $Q_2$, $Q_1$, and $Q_0$. Thus, from the time a thermometer code is first provided to circuitry 400 on output signals $OUT_1$–$OUT_{15}$, a corresponding binary code is provided at outputs $Q_3$, $Q_2$, $Q_1$ and $Q_0$ after three positive edge transitions of clock signal 482. Nevertheless, the multi-stage pipelined architecture of encoder circuitry 400 may receive a new thermometer code from outputs $OUT_1$–$OUT_{15}$ at each positive edge transition of clock signal 482.

As an example of the operation of encoder circuitry 400, if only output signals $OUT_1$–$OUT_5$ are logic ones, then output signals $OUT_1$–$OUT_7$ are latched by outputs 414a–g of flip-flops 412a–g, respectively, upon a first positive edge transition of clock signal 482. Moreover, output 474 of flip-flop 446 latches output signal $Q_8$ (logic zero), such that output $Q_3$ (most significant bit) will eventually be a logic zero after second and third positive edge transitions of clock signal 482.

After the second positive edge transition of clock signal 482, output signals $OUT_5$–$OUT_7$ (as originally received prior to the first positive edge transition of clock signal 482) are latched by outputs 428, 460 and 434 of flip-flops 426a–c, from outputs 420a–c of flip-flops 412e–g through multiplexers 418a–c, respectively. Also, output 470 of flip-flop 456 latches output signal $Q_4$ (a logic one as originally received prior to the first positive edge transition of clock signal 482), such that output 486($Q_2$) of flip-flop 472 will eventually be a logic one after a third positive edge transition of clock signal 482.

After the third positive edge transition of clock signal 482, output 488($Q_1$) of flip-flop 466 is a logic zero (output signal $Q_6$ as originally received prior to the first positive edge transition of clock signal 482). Also, output signal $OUT_5$ (as originally received prior to the first positive edge transition of clock signal 482) is latched by output 490($Q_0$) of flip-flop 440 from output 428 of flip-flop 426a through multiplexer 432.

Consequently, after the third positive edge transition of clock signal 482, outputs $Q_3$, $Q_2$, $Q_1$ and $Q_0$ provide a binary code of 0101, representing a digital value of "5" corresponding to the thermometer code having a digital value of "5" originally received from output signals $OUT_1$–$OUT_{15}$ prior to the first positive edge transition of clock signal 482.

Thus, encoder circuitry 400 first determines whether output $Q_3$ should be either a logic one or a logic zero, based upon whether the input thermometer code has a digital value of at least "8". Then, encoder circuitry 400 determines whether output $Q_2$ should be either a logic one or a logic zero, based upon whether the thermometer code has a digital value of at least "4" (if the thermometer code's digital value is less than "8") or of at least "12" (if the thermometer code's digital value is at least "8"). Then, encoder circuitry 400 determines whether output $Q_1$ should be either a logic one or a logic zero, based upon whether the thermometer code has a digital value of at least "2" (if the thermometer code's digital value is less than "4"), or of at least "6" (if the thermometer code's digital value is at least "4"), or of at least "10" (if the thermometer code's digital code is less than "12"), or of at least "14" (if the thermometer code's digital value is at least "12").

Also, encoder circuitry 400 determines whether output $Q_0$ should be either a logic one or a logic zero, based upon whether the thermometer code has a digital value of at least "1" (if the thermometer code's digital value is less than "2"), or of at least "3" (if the thermometer code's digital value is at least "2"), or of at least "5" (if the thermometer code's digital value is less than "6"), or of at least "7" (if the thermometer code's digital value is at least "6"), or of at least "9" (if the thermometer code's digital value is less than "10"), or of at least "11" (if the thermometer code's digital value is at least "10"), or of at least "13" (if the thermometer code's digital value is less than "14"), or of at least "15" (if the thermometer code's digital value is at least "14"). In this manner, circuitry 400 implements a binary search approach to encode parallel thermometer code output signals $OUT_1$–$OUT_{15}$ into a corresponding binary code output ($Q_3$, $Q_2$, $Q_1$, $Q_0$).

In an important aspect of the preferred embodiment, only one of output signals $OUT_1$–$OUT_{15}$ controls a determination of whether the thermometer code's corresponding binary code output is at least a particular number. Consequently, the binary code output ($Q_3$, $Q_2$, $Q_1$, $Q_0$) of encoder circuitry 400 is less subject to negative consequences of errors in a thermometer code received from output signals $OUT_1$-$OUT_{15}$. For example, regardless of whether any or all of output signals $OUT_9$-$OUT_{15}$ are incorrectly a logic one, the accuracy of the binary code output ($Q_3$, $Q_2$, $Q_1$, $Q_0$) of encoder circuitry 400 is unaffected if output signal $OUT_8$ is correctly a logic zero. Similarly, regardless of whether any or all of output signals $OUT_5$-$OUT_7$ are incorrectly a logic one, the accuracy of the binary code output ($Q_3$, $Q_2$, $Q_1$, $Q_0$) of encoder circuitry 400 is unaffected if output signal $OUT_4$ is correctly a logic zero. Likewise, regardless of whether any of output signals $OUT_{13}$-$OUT_{15}$ are incorrectly a logic one, the accuracy of the binary code output ($Q_3$, $Q_2$, $Q_1$, $Q_0$) of encoder circuitry 400 is unaffected if output signal $OUT_{12}$ is correctly a logic zero.

Figure 7:
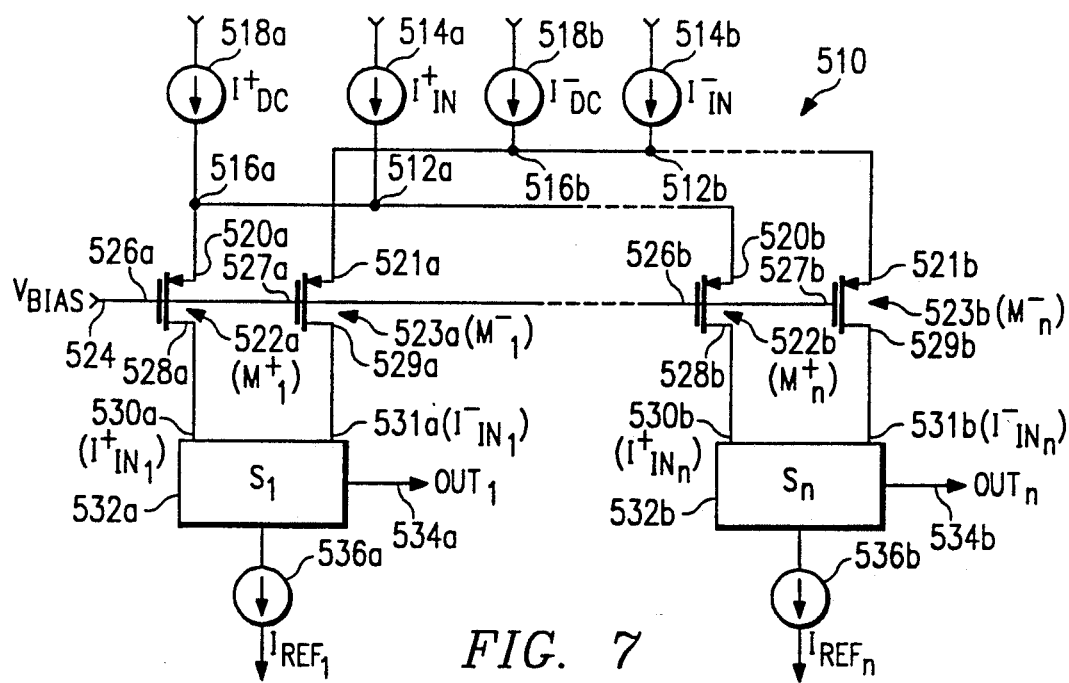
FIG. 7 illustrates a first alternative embodiment of circuitry for current input analog to digital conversion.

FIG. 7 illustrates a first alternative embodiment of circuitry for current input analog to digital conversion, where the current input is a differential current input. In circuitry 510, a first input current node 512a is coupled to a first input current source 514a ($I_{IN}{}^+$) and to a first DC current node 516a. First DC current node 516a is coupled to a first DC current source 518a ($I_{DC}{}^+$). First input current path node 512a is further coupled to a source 520a of a p-channel transistor 522a (direction transistor $M_1{}^+$), and to a source 520b of a p-channel transistor 522b (direction transistor $M_n{}^+$). A second input current node 512b is coupled to a second input current source 514b ($I_{IN}{}^-$) and to a second DC current node 516b. Second DC current node 516b is coupled to a second DC current source 518b ($I_{DC}{}^-$). Second input current path node 512b is further coupled to a source 521a of a p-channel transistor 523a (direction transistor $M_1{}^-$), and to a source 521b of a p-channel transistor 523b (direction transistor $M_n{}^-$).

A bias voltage 524 is coupled to a gate 526a of direction transistor $M_1{}^+$, to a gate 527a of direction transistor $M_1{}^-$, to a gate 526b of direction transistor $M_n{}^+$, and to a gate 527b of direction transistor $M^-$. A drain 528b of direction transistor $M_1{}^+$ is coupled to an input current path node 530a ($I_{INi}{}^+$) of an output circuitry 532a ($S_1$). A drain 529a of direction transistor $M_1{}^-$ is coupled to an input current path node 531a ($I_{INn}{}^-$) of output circuitry $S_1$. A drain 528b of direction transistor $M_n{}^+$ is coupled to an input current path node 530b ($I_{INn}{}^+$) of an output circuitry 532b ($S_n$). A drain 529b of direction transistor $M_n{}^-$ is coupled to an input current path node 531b ($I_{INn}{}^-$) of output circuitry $S_n$. Output circuitry $S_1$ is coupled to output signal 534a ($OUT_1$) and to a reference current source 536a ($I_{REF1}$). Output Circuitry $S_n$ is coupled to output signal 534b ($OUT_n$) and to a reference current source 536b ($I_{REFn}$). Direction transistors $M_1{}^+$-$M_n{}^+$ and $M_1{}^-$-$M_n{}^-$ approximately equal channel lengths and widths.

Similar to circuitry 10 of FIG. 1, transistor $M_i$ (where i=1...n), output circuitry $S_i$ and reference current source $I_{REFi}$ form a module which may be duplicated n times (where n is an integer value) as desired to achieve a particular bit resolution for A/D conversion circuitry 510. Digital logic values are provided by circuitry 510 on output signals $OUT_1$-$OUT_n$ based upon a variable difference between current levels through input current sources 514a ($I_{IN}{}^+$) and 514b ($I_{IN}{}^-$). Optional DC current sources 518b ($I_{DC}{}^+$) and 518b ($I_{DC}{}^-$) supply substantially constant levels of current to DC current nodes 516a and 516b, respectively. This ensures a minimum level of current through direction transistors $M_1$-$M_n$ in order to decrease a time for circuitry 510 to respond to a change in the difference between current levels through input current sources 514a ($I_{IN}{}^+$) and 514b ($I_{IN}{}^-$). This operation is particularly important when current through input current sources $I_{IN}{}^+$ and $I_{IN}{}^-$ is small. Typically, a current through DC current source 518b ($I_{DC}{}^+$) is approximately equal to a current through DC current source 518b ($I_{DC}{}^-$). Thus, current from input current source 514a ($I_{IN}{}^+$) is combined with current from DC current source 518b ($I_{DC}{}^+$), and the total combined current from input current source 514a ($I_{IN}{}^+$) and DC current source 518b ($I_{DC}{}^+$) is supplied to direction transistors $M_1{}^+$-$M_n{}^+$. Direction transistors $M_1{}^+$-$M_n{}^+$ split the total combined current from input current source 514a ($I_{IN}{}^+$) and DC current source 518b ($I_{DC}{}^+$) into n equal parts which are respectively directed to input current path nodes $I_{INI}{}^+$-$I_{INn}{}^+$. Similar to circuitry 10 of FIG. 1, direction transistors $M_1{}^+$-$M_n{}^+$ are carefully matched to achieve desired current division ratios.

Current from input current source 514b ($I_{IN}{}^-$) is combined with current from DC current source 518b ($I_{DC}{}^-$), and the total combined current from input current source 514b ($I_{IN}{}^-$) and DC current source 518b ($I_{DC}{}^-$) is supplied to direction transistors $M_1{}^-$-$M_n{}^-$. Direction transistors $M_1{}^-$-$M_n{}^-$ split the total combined current from input current source 514b ($I_{IN}{}^-$) and DC current source 518b ($I_{DC}{}^-$) into n equal parts which are respectively directed to input current path nodes $I_{INI}{}^-$-$I_{INn}{}^-$. Direction transistors $M_1{}^-$-$M_n{}^-$ are carefully matched to achieve desired current division ratios.

Output circuitry $S_i$ (where i=1...n) compares a difference between current levels through input current path nodes $I_{INi}{}^+$ and $I_{INi}{}^-$ against a current through reference current source $I_{REFi}$. If a difference between current levels through input current path nodes $I_{INi}{}^+$ and $I_{INi}{}^-$ is greater than current through reference current source $I_{REFi}$, then output signal $OUT_i$ is a logic "1". If a difference between current levels through input current path nodes $I_{INi}{}^+$ and $I_{INi}{}^-$ is less than current through reference current source $I_{REFi}$, then output signal $OUT_i$ is a logic "0".

Figure 8:
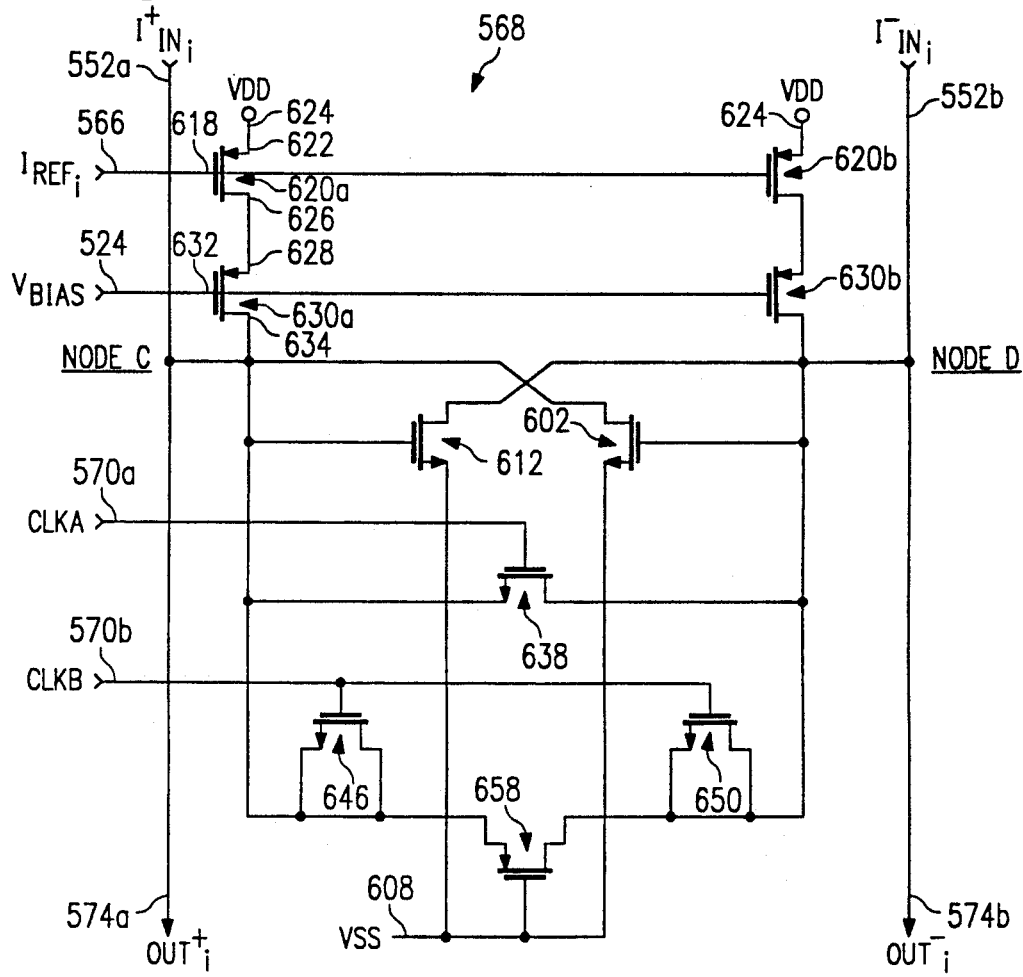
FIG. 8 illustrates comparison circuitry for use with the first alternative embodiment of circuitry for current input analog to digital conversion.

FIG. 8 illustrates comparison circuitry 568 of output circuitry $S_i$ (where i=1...n) of FIG. 7. Circuitry 568 is similar to circuitry 68 of FIG. 3. Positive output signal 574a ($OUT_i{}^+$) of FIG. 8 is equivalent to positive output signal 74a ($OUT_i{}^+$) of FIG. 3. Negative output signal 574b ($OUT_i{}^-$) of FIG. 8 is equivalent to negative output signal 74b ($OUT_i{}^-$) of FIG. 3. Clock input 570a (ClkA) of FIG. 8 is equivalent to clock input 70a (ClkA) of FIG. 3. Inverted clock input 570b (ClkB) of FIG. 8 is equivalent to inverted clock input 70b (ClkB) of FIG. 3. Node C of FIG. 8 is equivalent to Node A of FIG. 3. Node D of FIG. 8 is equivalent to Node B of FIG. 3. Bias voltage 524 of FIG. 8 is equivalent to bias voltage 24 of FIG. 3. Reference current input 566 ($I_{REFi}$) of FIG. 8 is equivalent to reference current input 66 ($I_{REFi}$) of FIG. 3. $V_{ss}$ 608 of FIG. 8 is equivalent to $V_{ss}$ 108 of FIG. 3. $V_{DD}$ 624 of FIG. 8 is equivalent to $V_{DD}$ 124 of FIG. 3. Capacitance transistor 650 of FIG. 8 is equivalent to capacitance transistor 150 of FIG. 3. Equalization transistor 658 of FIG. 8 is equivalent to equalization transistor 158 of FIG. 3. Capacitance transistor 646 of FIG. 8 is equivalent to capacitance transistor 146 of FIG. 3. Reset transistor 638 of FIG. 8 is equivalent to reset transistor 138 of FIG. 3. Regeneration transistor 602 of FIG. 8 is equivalent to regeneration transistor 102 of FIG. 3. Regeneration transistor 612 of FIG. 8 is equivalent to regeneration transistor 112 of FIG. 3. Balance transistor 630b of FIG. 8 is equivalent to balance transistor 130 of FIG. 3. Current mirror transistor 620b of FIG. 8 is equivalent to current mirror transistor 120 of FIG. 3. Input current path node 552a ($I_{INi}+$) of FIG. 8 is equivalent to input current path node 52 ($I_{INi}$) of FIG. 3.

Comparison circuitry 568 of FIG. 8 further comprises input current path node 552b ($I_{INi}-$) coupled to Node D. Moreover, comparison circuitry 568 comprises a current mirror transistor 620a and a balance transistor 630a. A source 622 of current mirror transistor 620a is coupled to $V_{DD}$ 624. A gate 618 of current mirror transistor 620a is coupled to reference current input 566 ($I_{REFi}$), and a drain 626 of current mirror transistor 620a is coupled to a source 628 of balance transistor 630a. A gate 632 of balance transistor 630a is coupled to bias voltage 524, and a drain 634 of balance transistor 630a is coupled to Node C.

In operation, a current through balance transistor 630b is substantially equal to a current through current mirror transistor 620b, and a current through balance transistor 630a is substantially equal to a current through current mirror transistor 620a. Consequently, linearly scaled thermometer codes are provided by circuitry 510 of FIG. 7 on output signals $OUT_1$-$OUT_n$, based in part upon currents through current mirror transistors 620a-b. A current through current mirror transistor 620a may be represented as $I_{REFi}+$, and a current through mirror transistor 620b may be represented as $I_{REFi}-$. Thus, in order to achieve a linearly scaled thermometer code on output signals $OUT_1$-$OUT_n$ of FIG. 7, a difference between $I_{REFi}+$ and $I_{REFi}-$ may be established at $$I_{REFi}- - I_{REFi}+ = [max.(I_{IN}+ - I_{IN}-) \times i/2^{no.\ bits\ resolution}] \times 1/n$$

where n equals $2^{no.\ bits\ resolution} - 1$, where $i = (1...n)$, where max. ($I_{IN}+ - I_{IN}-$) is the maximum scaled difference between currents through input current sources $I_{IN}+$ and $I_{IN}-$, and where $I_{IN}+$ is typically always greater than $I_{IN}-$.

Alternatively, if $I_{IN}+$ is not always greater than $I_{IN}-$, such that a median difference between $I_{IN}+$ and $I_{IN}-$ is approximately zero, then $I_{REFi}+$ be established as being equal to $I_{REFi}-$ for $S_i$ where $i = 2^{no.\ bits\ resolution}/2$. Where $i < 2^{no.\ bits\ resolution}/2$, a difference between $I_{REFi}+$ and $I_{REFi}-$ may be established at $$I_{REFi}+ - I_{REFi}- = [max.(I_{IN}- - I_{IN}+) \times i/2^{no.\ bits\ resolution}] \times 1/n$$

in order to achieve a linearly scaled thermometer code on output signals $OUT_1$-$OUT_n$ of FIG. 7. Where $i > 2^{no.\ bits\ resolution}/2$, a difference between $I_{REFi}+$ and $I_{REFi}-$ may be established at $$I_{REFi}- - I_{REFi}+ = [max.(I_{IN}+ - I_{IN}-) \times i/2^{no.\ bits\ resolution}] \times 1/n$$

in order to achieve a linearly scaled thermometer code on output signals $OUT_1$-$OUT_n$ of FIG. 7.

Operation of comparison circuitry 568 of FIG. 8 is substantially identical to the operation of comparison circuitry 68 of FIG. 3, with the primary difference being the sources of current through Node C of FIG. 8 relative to Node A of FIG. 3 and the sources of current through Node D of FIG. 8 relative to Node B of FIG. 3. Similar to comparison circuitry 68 of FIG. 3, if current through Node C exceeds current through Node D, then a voltage at output signal 574a ($OUT_i+$) will exceed a voltage at output signal 574b ($OUT_i-$). Alternatively, if a current through Node D exceeds a current through Node C, then a voltage at output signal 574b ($OUT_i-$) will exceed a voltage at output signal 574a ($OUT_i+$).

By appropriately establishing a difference between currents $I_{REFi}+$ and $I_{REFi}-$, linearly or non-linearly scaled thermometer codes may be provided on output signals $OUT_1$-$OUT_n$. The approach of FIGS. 7 and 8 provides technical advantages, because circuitry 510 may be interfaced with other circuitry having differential current signals, and further because the total reference current (sum of $I_{REFi}+$ and $I_{REFi}-$) for each output circuitry $S_i$ may be the same, such that direction transistors $M_1$-$M_n$ may more readily achieve desired current division ratios, because the only variation between each output circuitry $S_1$-$S_n$, is a difference between $I_{REFi}+$ and $I_{REFi}-$. The difference between $I_{REFi}+$ and $I_{REFi}-$ may be established by adjusting channel dimensions of current mirror transistors 620a and 620b, respectively.

With reference to FIG. 1, by splitting current from input current source $I_{IN}$ into n equal parts, the current through each input current path node $I_{INi}$ is attenuated, which may be undesirable when current through input current source $I_{IN}$ is small. In FIG. 1, if an 8-bit resolution A/D conversion is desired, then n=255, and current through input current path node $I_{INi}$ is approximately 0.15 microamps when $I_{IN} + I_{DC}$ = approximately 10 milliamps, where 10 milliamps is a typical full scale output level for video digital to analog inverters. As a current through $I_{INi}$ is diminished, a speed and reliability of output circuitry $S_1$ of FIG. 1 may also be diminished.

This concern may be addressed in an alternative embodiment, in which direction transistors $M_1$-$M_n$ divide the input current so that each of reference currents $I_{REF1}$-$I_{REFn}$ are equal. To achieve such a division of current through direction transistors $M_1$-$M_n$, the channel dimensions of direction transistors $M_1$-$M_n$ may be varied to achieve a desired scaling of thermometer code outputs $OUT_1$-$OUT_n$, while a current through each of reference current sources $I_{REF1}$-$I_{REFn}$ is equal. To achieve a linearly scaled thermometer code at outputs $OUT_1$-$OUT_n$, each of direction transistors $M_1$-$M_n$ may have a substantially equal channel length and a varying channel width. Where a channel width of direction transistor $M_1$ is represented as $W_1$, a channel width of transistors $M_2$-$M_n$ may be established at $W_i = W_1/i$ (where $i = 1...n$). An advantage of this approach is that current through $M_i$ is higher when i is smaller. Importantly, when current through input current source $I_{IN}$ is small, the critical transition point where $OUT_i$ is a logic "1" and where $OUT_{i+1}$ is a logic "0" occurs where i is small. Consequently, it is desirable for more current to be directed through input current path node $I_{INi}$ at the critical transition point where i is small, because a time required to perform the analog to digital conversion is dependent upon a time for output circuitry $S_i$ to produce a logic "1" at the critical transition point. Also, output circuitry $S_i$ may produce a logic "1" at $OUT_i$ more quickly when current through input current path node $I_{INi}$ is increased. Therefore, this approach provides the advantage that the threshold current level required through input current path node $I_{INi}$ to produce a logic "1" at $OUT_i$ is substantially the same for each output circuitry $S_1-S_n$, such that a delay to produce a logic "1" at $OUT_i$ is more consistent and is substantially the same for each output circuitry $S_i$ at the critical transition point when current through input current path node $I_{INi}$ is near the required threshold current level. A shortcoming of this approach is that channel widths for direction transistors $M_1-M_n$ are not incremented by uniform amounts, such that a parallel connection of unit size devices may become unwieldy, with a channel width $(W_1)$ of direction transistor $M_1$ being arranged as n! (n factorial) unit devices in parallel. Moreover, as i increases, accuracy becomes more critical for $I_{REFi}$ and $M_i$, because signal attenuation of $I_{IN}$ by $M_i$ increases as i increases.

As an example of another alternative, if n=15, then direction transistors $M_1-M_7$ may have channel widths approximately twice as large as direction transistors $M_9-M_{15}$, respectively. This facilitates the parallel arrangement of unit devices to achieve desired variations of channel widths, and thereby alleviates negative consequences of inaccuracy due to signal attenuations at direction transistors $M_9-M_{15}$.

In another alternative, if n=31 to achieve a 5-bit resolution analog to digital conversion, then odd-numbered $M_i$ may have channel widths twice as large as even-numbered $M_i$. Thus, odd-numbered output circuitry $S_i$ may operate at high sample rates to achieve a 4-bit resolution analog to digital conversion in situations where even-numbered output circuitry $S_i$ are unable to appropriately operate at the higher sample rates.

Importantly, in the preferred embodiment, the substantially even division by direction transistors $M_1-M_n$ of current from input current source $I_{IN}$, as described hereinabove in connection with FIG. 1, results in sufficient current through each input current path node $I_{INi}$ when n=15 and current through input current source $I_{IN}$ is 10 milliamps, where current through DC current source $I_{DC}$ is approximately 315 microamps.

Figure 9:
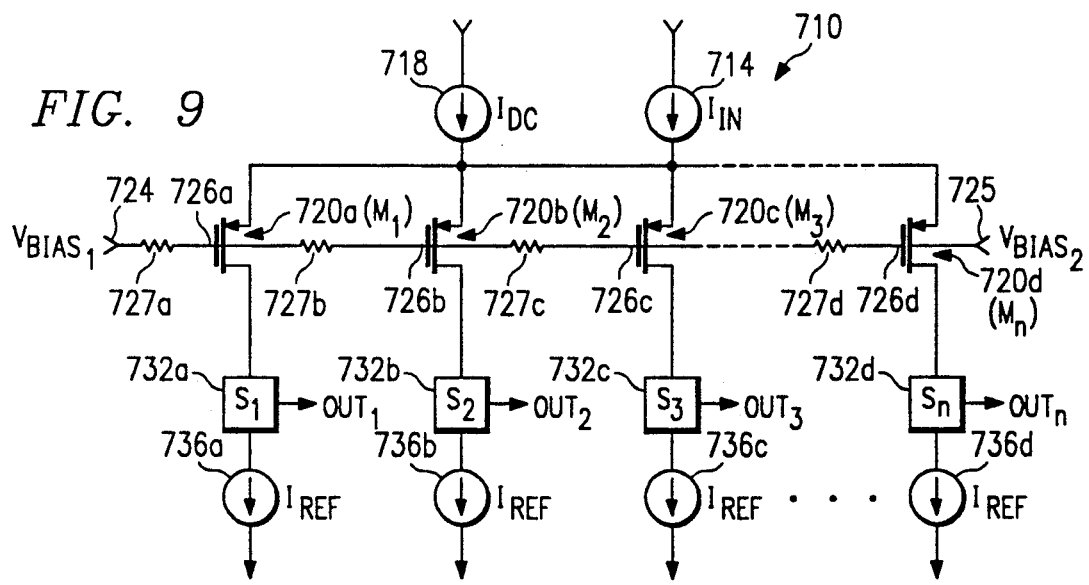
FIG. 9 illustrates a second alternative embodiment of circuitry for current input analog to digital conversion.

FIG. 9 illustrates a second alternative embodiment of circuitry for current input analog to digital conversion. In circuitry 710 of FIG. 9, an input current source 714 $(I_{IN})$ is equivalent to input current source 14 $(I_{IN})$ of FIG. 1. A DC current source 718 $(I_{DC})$ is equivalent to DC current source 18 $(I_{DC})$ of FIG. 1. A first bias voltage 724 $(V_{BIASi})$ is equivalent to bias voltage 24 of FIG. 1. Direction transistors 720a-d $(M_1-M_n)$ are equivalent to direction transistors 20a-d $(M_1-M_n)$ of FIG. 1. Output circuitry 732a-d $(S_1-S_n)$ are equivalent to output circuitry 32a-d $(S_1-S_n)$ of FIG. 1. Reference current sources 736a-d $(I_{REF})$ are equivalent to reference current sources 36a-d $(I_{REFi}-I_{REFn})$ of FIG. 1.

Additionally, in circuitry 710 of FIG. 9, first bias voltage 724 $(V_{BIAS1})$ is coupled through a resistor 727a to a gate 726a of direction transistor 720a $(M_1)$. Gate 726a is coupled through a resistor 727b to a gate 726b of direction transistor 720b $(M_2)$. Gate 726b is coupled through a resistor 727c to a gate 726c of direction transistor 720c $(M_3)$. Likewise, a gate 726d of direction transistor 720d $(M_n)$ is coupled through a resistor 727d to a gate of a direction transistor $M_{n-1}$ (not shown). Gate 726d of direction transistor 720d $(M_n)$ is further coupled to a second bias voltage 725 $(V_{BIAS2})$ having a voltage less than first bias voltage 724 $(V_{BIAS1})$.

First bias voltage 724 $(V_{BIAS1})$ may be alternatively replaced by a current source (not shown) providing current through resistors 727a-d. In circuitry 710 of FIG. 9, each of gates 726a-d of direction transistors $M_1-M_n$ has a different voltage, resulting from voltage drops across resistors 726a-d, respectively. In this manner, a gate bias voltage of direction transistor $M_i$ (where i=1...n) diminishes as i increases, such that only direction transistor $M_1$ is initially turned on when current through input current source $I_{IN}$ is small. Also, successive additional ones of direction transistors $M_2-M_n$ are sequentially turned on as current through input current source $I_{IN}$ increases.

Thus, if $OUT_i$ is a logic "0", then direction transistor $M_{i+1}$ is turned off, and if $OUT_i$ is a logic "1", then direction transistor $M_{i+1}$ is turned on. Under this approach, available current from $I_{IN}$ and $I_{DC}$ is directed through particular ones of output circuitry $S_1-S_n$ that are more critical in indicating a point within a thermometer code where $OUT_i$ is a logic "1" and where $OUT_{i+1}$ is a logic "0". Using this approach, currents through reference current sources 736a-d $(I_{REF})$ may each be equal. Alternatively, currents through reference current sources 736a-d may each be different, as in FIG. 1.

Alternatively, a strength of direction transistors $M_1-M_n$ may be progressively weakened as i increases, by coupling a source of each direction transistor $M_1-M_n$ through a respective resistor to current sources $I_{IN}$ and $I_{DC}$, with a resistance of each such resistor increasing as i increases.

Figure 10:
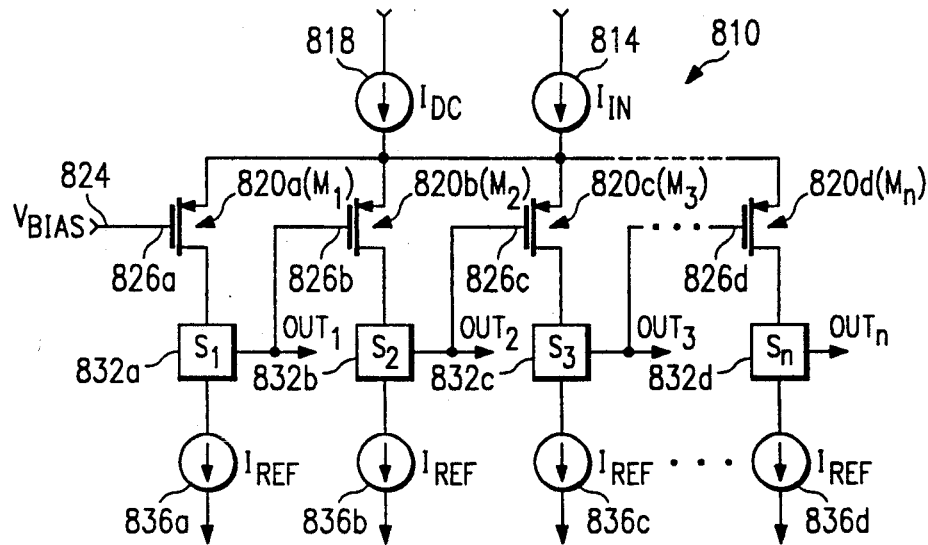
FIG. 10 illustrates a third alternative embodiment of circuitry for current input analog to digital conversion.

FIG. 10 illustrates a third alternative embodiment of circuitry for input analog to digital conversion. In circuitry 810 of FIG. 10, an input current source 814 $(I_{IN})$ is equivalent to input current source 714 $(I_{IN})$ of FIG. 9. A DC current source 818 $(I_{DC})$ is equivalent to DC current source 718 $(I_{DC})$ of FIG. 9. A bias voltage 824 is equivalent to first bias voltage 724 of FIG. 9. Direction transistors 820a-d $(M_1-M_n)$ are equivalent to direction transistors 720a-d $(M_1-M_n)$ of FIG. 9. Output circuitry 832a-d $(S_1-S_n)$ are equivalent to output circuitry 732a-d $(S_1-S_n)$ of FIG. 9. Reference current sources 836a-d $(I_{REF})$ are equivalent to reference current sources 736a-d $(I_{REF})$ of FIG. 9.

Circuitry 810 differs from circuitry 710 of FIG. 9, in that bias voltage 824 is coupled only to a gate 826a of direction transistor $M_1$; moreover, resistors such as resistors 727a-d are not used, and a second bias voltage such as second bias voltage 725 of FIG. 9 is not present.

In FIG. 10, an output signal $OUT_1$ of output circuitry 832a $(S_1)$ is coupled to a gate 826b of direction transistor $M_2$. An output signal $OUT_2$ of output circuitry 832b $(S_2)$ is coupled to a gate 826c of direction transistor $M_3$. A gate 826d of transistor $M_n$ is coupled to an output signal $OUT_{n-1}$ of an output circuitry $S_{n-1}$ (not shown). Circuitry 810 of FIG. 10 is similar to circuitry 710 of FIG. 9, because current from current sources $I_{IN}$ and $I_{DC}$ is directed to particular ones of output circuitry $S_1-S_n$ that are more critical in indicating a point within a thermometer code where $OUT_i$ is a logic "1" and where $OUT_{i+1}$ is a logic "0". Direction transistor $M_{i+1}$ is thus turned on if $OUT_i$ is a logic "1", and such that direction transistor $M_{i+1}$ is turned off if output signal $OUT_i$ is a logic "0". In this manner, circuitry 810 of FIG. 10 provides the sequential turn-on effect of circuitry 710 of FIG. 9, such that successive additional ones of direction transistors $M_1-M_n$ are turned on as current through input current source $I_{IN}$ increases.

Figure 11A:
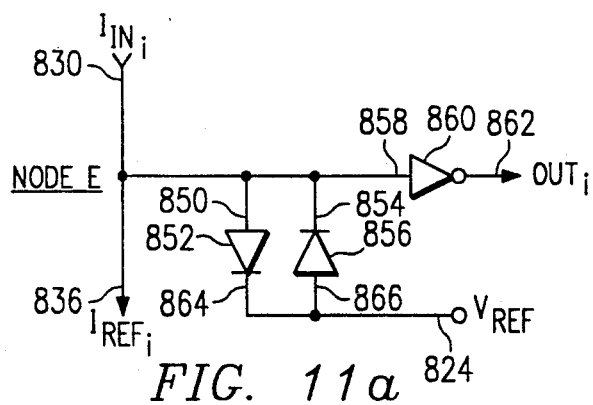
FIGS. 11a-d illustrate alternative embodiments of the comparison circuitry.
Figure 11B:
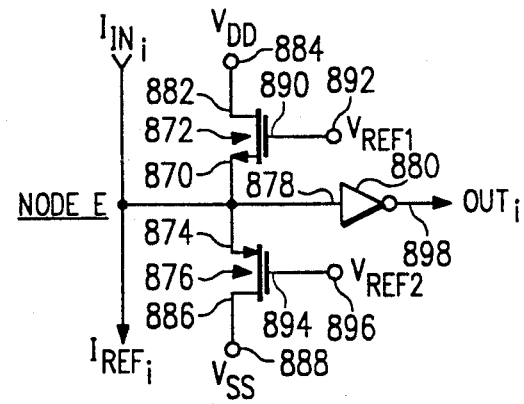
Figure 11C:
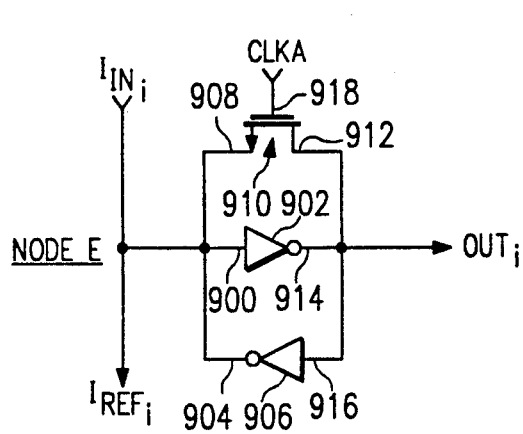

FIGS. 11a–d illustrate alternative embodiments of comparison circuitry 68 of FIG. 2. In FIGS. 11a–c, a single output $OUT_i$ is provided by each alternative embodiment of comparison circuitry 68, instead of differential voltage outputs $OUT_i+$ and $OUT_i-$ as shown in FIG. 2. The single output signal $OUT_i$ of FIGS. 11a–c may form any of output signals $OUT_1$–$OUT_n$ of FIG. 1. Similarly, differential output signals $OUT_i+$ and $OUT_i-$ of comparison circuitry 68 of FIG. 2 may form differential output signals of any output circuitry $S_1$–$S_n$ of FIG. 1, such that buffer circuitry 78a–b and sense amplification circuitry 86 of FIG. 2 are not required to perform the current input analog to digital conversion.

In FIG. 11a, input current path node 830 ($I_{INi}$) is coupled to a Node E, which is further coupled to a reference current source 836 ($I_{REFi}$). Input current path node 830 ($I_{INi}$) corresponds to any of input current path nodes $I_{IN1}$–$I_{INn}$ of FIG. 1. Reference current source 836 ($I_{REFi}$) corresponds to any of reference current sources $I_{REF1}$–$I_{REFn}$ of FIG. 1. In FIG. 11a, Node E is further coupled to an anode 850 of a diode 852, to a cathode 854 of a diode 856, and to an input 858 of a CMOS inverter 860. An output B62 of inverter 860 forms an output signal $OUT_i$, which corresponds to any of output signals $OUT_1$–$OUT_n$ of FIG. 1. A cathode 864 of diode 852 is coupled to an anode 866 of diode 856, and is further coupled to a reference voltage 824 ($V_{REF}$). If current through input current path node $I_{INi}$ exceeds current through reference current source $I_{REFi}$, then a voltage at Node E rises, such that a voltage at output signal $OUT_i$ decreases. If a current through input current path node $I_{INi}$ less than a current through reference current source $I_{REFi}$, then a voltage at Node E decreases, such that a voltage at output signal $OUT_i$ increases.

Diodes 852 and 856 each have a threshold voltage of $V_T$, such that a voltage at Node E is substantially restrained from rising more than one $V_T$ above reference Voltage 824 ($V_{REF}$) and is substantially restrained from falling more than one $V_T$ below reference voltage 824 ($V_{REF}$). A shortcoming of the approach in FIG. 11a is that a voltage at Node E may swing between $+V_T$ and $-V_T$ relative to $V_{REF}$. Thus, a voltage at Node E may not be narrowly controlled to ensure that direction transistors $M_1$–$M_n$ of FIG. 1 equally split a current received from current sources $I_{IN}$ and $I_{DC}$.

FIG. 11b is similar to FIG. 11a, in that an input current path node $I_{INi}$ is coupled to a Node E, which is further coupled to a reference current source $I_{REFi}$. Node E is coupled to a source 870 of an n-channel transistor 872, to a source 874 of a p-channel transistor 876, and to an input 878 of a CMOS inverter 880. A drain 882 of transistor 872 is coupled to a $V_{DD}$ 884. A drain 886 of transistor 876 is coupled to a $V_{SS}$ 888. A gate 890 of transistor 872 is coupled to a first reference voltage 892 ($V_{REF1}$), and a gate 894 of transistor 876 is coupled to a second reference voltage 896 ($V_{REF2}$). An output 898 of inverter 880 forms an output signal $OUT_i$. Each transistor 872 and 876 has a threshold voltage of $V_T$, such that a voltage at Node E is substantially restrained from rising more than one $V_T$ above second reference voltage $V_{REF2}$, and such that a voltage at Node E is substantially restrained from falling more than one $V_T$ below first reference voltage $V_{REF1}$.

A shortcoming of the approach in FIG. 11b is that first and second reference voltages $V_{REF1}$ and $V_{REF2}$ must be selected to allow a voltage at Node E to swing within a predetermined range of voltages within which neither transistor 872 nor transistor 876 is turned on. Thus, output signal $OUT_i$ may appropriately indicate whether a current through input current path node $I_{INi}$ is greater or less than a current through reference current source $I_{REFi}$, based upon whether a voltage at Node E is at a high or low end within the predetermined range of voltages. Consequently, the extent to which transistors 874 and 876 may narrowly control a voltage at Node E is limited by the requirement that Node E be allowed to swing within a predetermined range of voltages in order to appropriately indicate whether a current through input current path node $I_{INi}$ is greater or less than a current through reference current source $I_{REFi}$. Since a voltage at Node E must be allowed to swing, the extent to which transistors 872 and 876 may narrowly control the voltage at Node E is limited, so that an even division of current through direction transistor $M_1$–$M_n$ is more difficult to achieve.

FIG. 11c is similar to FIGS. 11a–b, in that an input current path node $I_{INi}$ is coupled to a Node E, which is further coupled to a reference current source $I_{REFi}$. Node E is coupled to an input 900 of a CMOS inverter 902, to an output 904 of a CMOS inverter 906, and to a source 908 of an n-channel transistor 910. A drain 912 of transistor 910 is coupled to an output 914 of inverter 902 and to an input 916 of inverter 906. Inverters 902 and 906 from a back-to-back inverter latch. Output 914 of inverter 902 forms an output signal $OUT_i$. A gate 918 of transistor 910 is coupled to a clock input ClkA. An advantage of the approach in FIG. 11c is that clock input ClkA may provide a low impedance path between Node E and output signal $OUT_i$ during reset, such that a voltage at Node E may be substantially equal for each output circuitry $S_1$–$S_n$ during reset, and such that direction transistors $M_1$–$M_n$ may evenly divide current from current sources $I_{IN}$ and $I_{DC}$.

After reset, transistor 910 forms a high impedance between Node E and output signal $OUT_i$, so that inverters 902 and 906 may latch a voltage at output signal $OUT_i$ based upon whether a current through input current path node $I_{INi}$ is greater or less than a current through reference current source $I_{REFi}$. Thus, if a current through input current path node $I_{INi}$ a current through reference current source $I_{REFi}$, then a voltage at output signal $OUT_i$ is low; alternatively, if a current through input current path node $I_{INi}$ is less than a current through reference current source $I_{REFi}$, then a voltage at output signal $OUT_i$ is high. A disadvantage of the approach in FIG. 11c is that a voltage at Node E is not substantially restrained from causing either direction transistor $M_i$ or reference current source $I_{REFi}$ enter a triode or reverse conduction state after reset. Consequently, the circuitry of FIG. 11c requires a longer time for a voltage at Node E to be substantially the same at each output circuitry $S_1$–$S_n$ during reset, thereby reducing a sample rate frequency of circuitry 10 of FIG. 1. Moreover, impedance levels and parasitic capacitances are highly unequal between Node E and output signal $OUT_i$, and also between each output circuitry $S_1$–$S_n$, resulting from variations in transistor sizes and in current through each reference current source $I_{REF1}$–$I_{REFn}$.

Figure 11D:
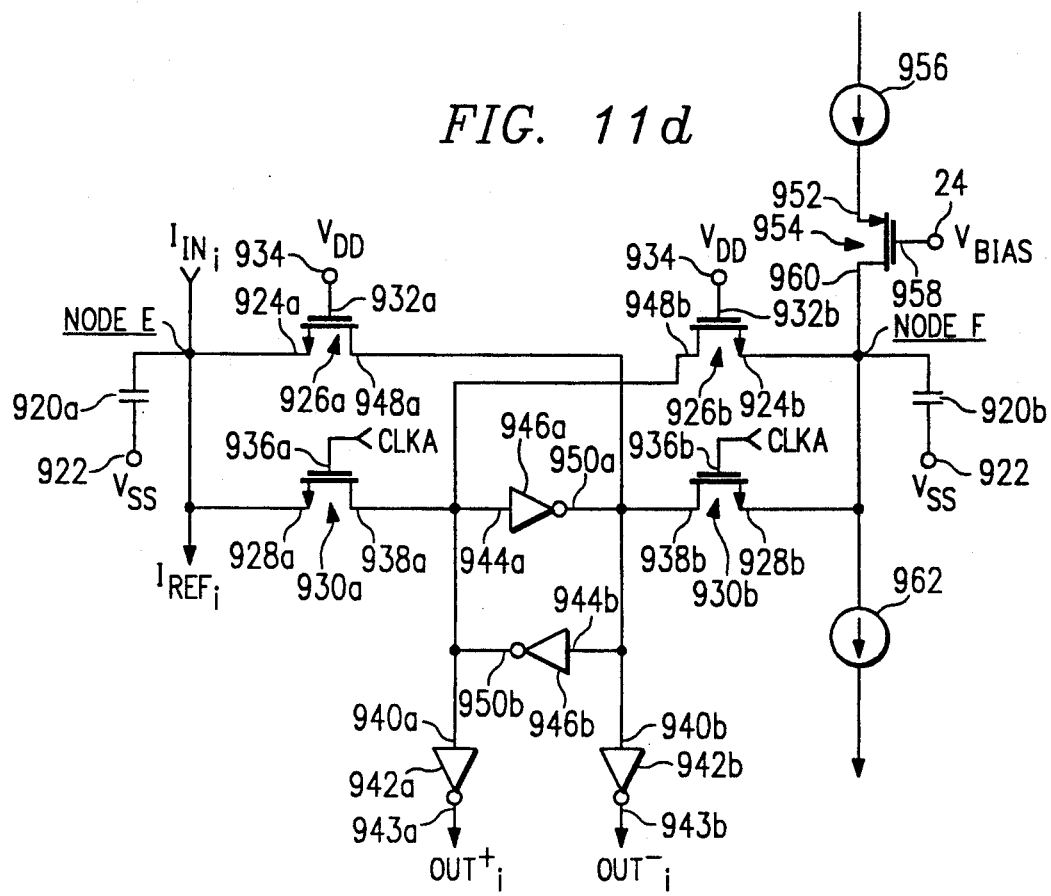

In FIG. 11d, an input current path node $I_{INi}$ is coupled to a Node E, which is further coupled to a reference current source $I_{REFi}$. Node E is coupled through a capacitor 920a to a $V_{SS}$ 922. Node E is also coupled to a source 924a of an n-channel equalization transistor 926a and to a source 928a of an n-channel reset transistor 930a. A gate 932a of equalization transistor 926a is coupled to a $V_{DD}$ 934. A gate 936a of reset transistor 930a is coupled to a clock input ClkA. A drain 938a of reset transistor 930a is coupled to an input 940a of a CMOS inverter 942a and to an input 944a of a CMOS inverter 946a. A drain 948a of equalization transistor 926a is coupled to an output 950a of inverter 946a, to an input 944b of a CMOS inverter 946b, to an input 940b of a CMOS inverter 942b, and to a drain 938b of an n-channel reset transistor 930b. A drain 948b of an n-channel equalization transistor 926b is coupled to drain 938a of reset transistor 930a. A gate 932b of equalization transistor 926b is coupled to $V_{DD}$ 934. A gate 936b of reset transistor 930b is coupled to clock input ClkA.

A source 924b of equalization transistor 926b is coupled to a source 928b of reset transistor 930b at a Node F. Node F is further coupled through a capacitor 920b to $V_{SS}$ 922. A source 952 of a p-channel balance transistor 954 is coupled to a reference current source 956 which provides a current equal to a current through reference current source $I_{REFi}$. A gate 958 of balance transistor 954 is coupled to bias voltage 24 of FIG. 1. A drain 960 of balance transistor 954 is coupled to Node F. Node F is further coupled to a reference current source 962 which sinks a current equal to a current through reference current source $I_{REFi}$.

An output 950b of inverter 946b is coupled to input 944a of inverter 946a. An output 943a of inverter 942a forms a positive output signal $OUT_i^+$. An output 943b of inverter 942b forms a negative output signal $OUT_i^-$. Similar to comparison circuitry 68 of FIG. 3, the comparison circuitry of FIG. 11d is fully balanced, with capacitor 920a balancing capacitor 920b, with equalization transistor 926a balancing equalization transistor 926b, with reset transistor 930a balancing reset transistor 930b, with inverter 946a balancing inverter 946b, with inverter 942a balancing inverter 942b, with Node E balancing Node F, with input current path node $I_{INi}$ balancing drain 960 of balance transistor 954, with balance transistor 954 balancing $M_i$, and with reference current source $I_{REFi}$ balancing reference current source 962.

Upon reset, clock input ClkA is high, resulting in reset transistors 930a and 930b providing low impedance paths between Node E and Node F, so that direction transistors $M_1$-$M_n$ may substantially evenly divide current from current sources $I_{IN}$ and $I_{DC}$.

After reset, clock input ClkA is low, resulting in reset transistors 930a and 930b being turned off, so that back-to-back inverters 946a and 946b quickly develop a differential voltage between output signals $OUT_i^+$ and $OUT_i^-$, based upon whether a current through input current path node $I_{INi}$ is greater or less than a current through reference current source $I_{REFi}$. After reset, capacitors 920a and 920b partially restrain voltages at Node E and Node F from abruptly changing, so that a differential voltage between output signals $OUT_i^+$ and $OUT_i^-$ may be developed more smoothly.

If a current through input current path node $I_{INi}$ exceeds a current through reference current source $I_{REFi}$, then back-to-back inverters 946a and 946b latch a high voltage at input 940b of inverter 942b and a low voltage at input 940a of inverter 942a. Consequently, output signal $OUT_i^+$ has a positive voltage relative to output signal $OUT_i^-$. If a current through input current path node $I_{INi}$ is less than a current through reference current source $I_{REFi}$, then back-to-back inverters 946a and 946b latch a low voltage at input 940b of inverter 942b and a high voltage at input 940a of inverter 942a. Consequently, output signal $OUT_i^+$ has a negative voltage relative to output signal $OUT_i^-$. After reset, equalization transistors 926a and 926b are saturated at a low controlled current, so that direction transistor $M_i$ is substantially restrained from entering a triode or reverse conduction state.

Figure 12:
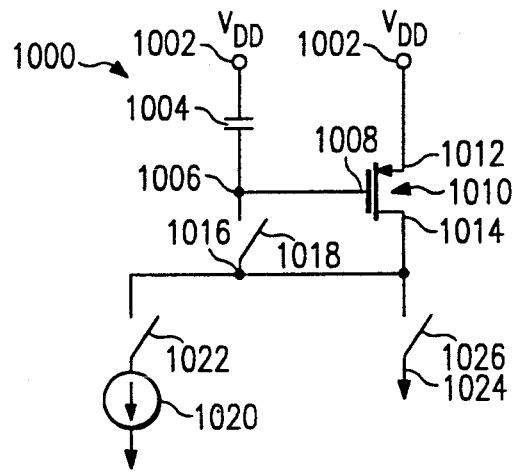
FIG. 12 illustrates optional current copier circuitry for use with the circuitry for current input analog to digital conversion of the preferred and alternative embodiments.

FIG. 12 illustrates optional current copier circuitry 1000 for use with the circuitry described hereinabove for current input analog to digital conversion of the preferred and alternative embodiments. A $V_{DD}$ 1002 is coupled through a capacitor 1004 to a node 1006. Node 1006 is coupled to a gate 1008 of a p-channel transistor 1010. A source 1012 of transistor 1010 is coupled to $V_{DD}$ 1002. A drain 1014 of transistor 1010 is coupled to a node 1016. Node 1016 is selectively coupled to node 1006 by a switch 1018. Node 1016 is selectively coupled to a current source 1020 by a switch 1022. Node 1016 is selectively coupled to an output current path 1024 by a switch 1026.

As an example, current source 1020 may conduct an input current, and output current path 1024 may be coupled to input current node 12 ($I_{IN}$) of FIG. 1. Initially, switch 1022 and switch 1018 are closed, so that node 1016 is coupled to node 1006 and is further coupled to current source 1020. Also, switch 1026 is initially open, so that node 1016 is not coupled to output current path 1024. In this manner, capacitor 1004 is eventually charged based upon a current through current source 1020.

After capacitor 1004 is charged, switch 1018 and switch 1022 are opened, so that node 1016 is no longer coupled to current source 1020 and is no longer coupled to node 1006. Then, switch 1026 is closed, so that node 1016 is coupled to output current path 1024. Thus, after capacitor 1004 is charged, capacitor 1004 may provide source-to-gate voltage for transistor 1010, so that transistor 1010 may conduct a current through drain 1014 to output current path 1024 which is substantially equal to a current conducted earlier by current source 1020. In this manner, current copier circuitry 1000 provides a sample and hold function, such that a level of current through current source 1020 may be sampled and then later provided to output current path 1024.

A technical advantage of current copier circuitry 1000 is that a current provided to output current path 1024 is substantially constant during a time required for circuitry 10 of FIG. 1 to perform a current input analog to digital conversion. By having a substantially constant current through input current node 12 of FIG. 1, the current input analog to digital conversion may be more accurate, because negative consequences of changes in magnitude and direction of input current $I_{IN}$ are substantially avoided. In another example, current copier circuitry 1000 may be inserted between a direction transistor $M_i$ and an input current path node $I_{INi}$ of FIG. 1 by coupling current source 1020 to a drain of the direction transistor $M_i$ and by coupling output current path 1024 to the input current path node $I_{INi}$.

Figure 13A:
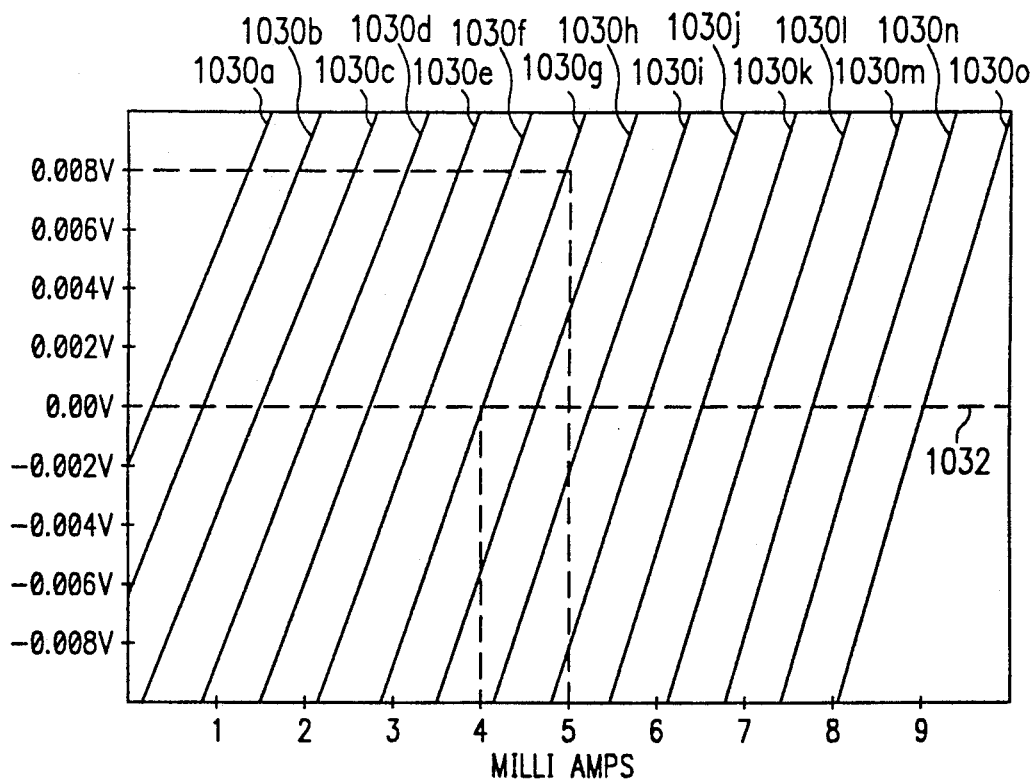
FIGS. 13a-c illustrate graphs showing a performance of the circuitry for current input analog to digital conversion of the preferred embodiment.
Figure 13B:
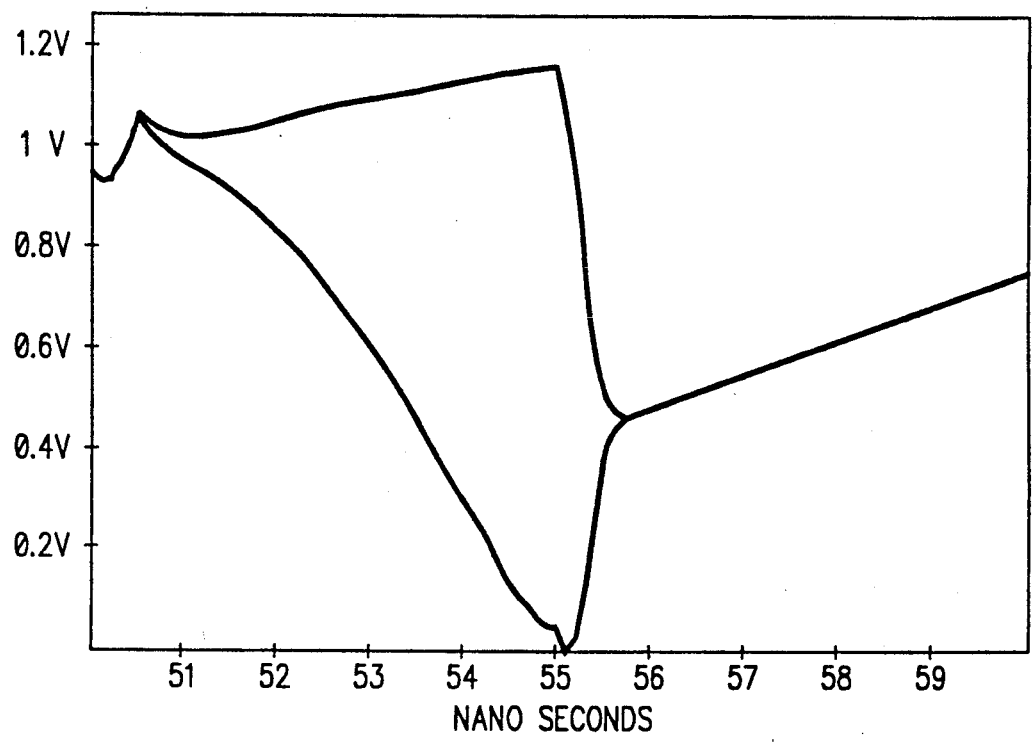
Figure 13C:
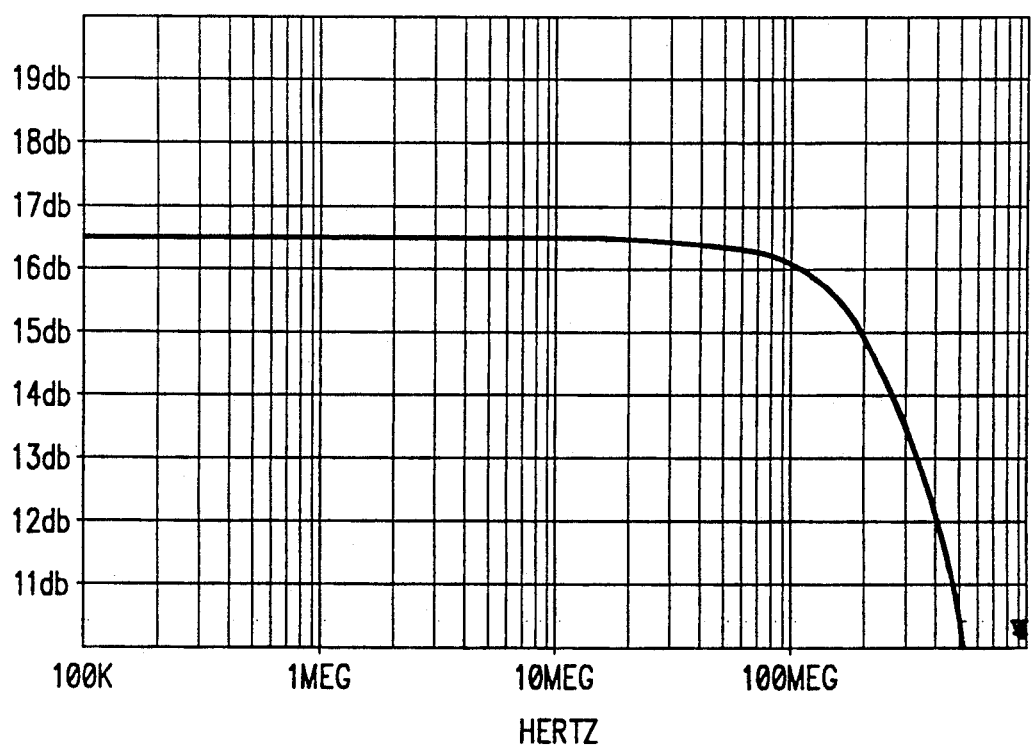

FIGS. 13a-c illustrate graphs showing a performance of circuitry 10 of FIG. 1 and output circuitry 50 ($S_i$) of FIG. 2, for a 4-bit (n=15) resolution analog to digital conversion. In FIG. 13a, a differential voltage between output signals $OUT_i^+$ and $OUT_i^-$ of comparison circuitry 68 of FIG. 2 is plotted against current through $I_{IN}$. As current through $I_{IN}$ increases from 0 milliamps to a full scale current level of approximately 10 milliamps ("ma"), a voltage at clock input ClkA is held at 5 volts. The intersections of each of lines 1030a–o with zero voltage line 1032 are uniformly spaced across the range of currents through $I_{IN}$. Moreover, each increment of 1 ma of current through $I_{IN}$ results in approximately 8 mV of differential voltage between output signals $OUT_i+$ and $OUT_i-$. For a 4-bit resolution current input analog to digital conversion where the full scale current level is approximately 10 ma, a least significant bit ("LSB") of current through $I_{IN}$ is approximately $$\text{one LSB of current} = 10 \text{ ma} / 2^4 = \frac{1}{4} \text{ ma} = 0.625 \text{ ma}.$$

Consequently, each ½ LSB of current through $I_{IN}$ is approximately 5/16 ma, and each increment of 5/16 ma (½ LSB) results in approximately 2.5 mV of differential voltage between output signals $OUT_i+$ and $OUT_i-$.

In FIG. 13b, a differential voltage between output signals $OUT_i+$ and $OUT_i-$ of comparison circuitry 68 of FIG. 2 is plotted against time, for a 4-bit (n=15) resolution analog to digital conversion, where current through $I_{IN}$ is approximately 5/16 ma (½ LSB of a full scale current level of approximately 10 ma). In FIG. 13b, the differential voltage between output signals $OUT_i+$ and $OUT_i-$ requires 5 nanoseconds to reset from approximately 1 volt to approximately 0 volts, and then requires another 5 nanoseconds after reset to rise from approximately 0 volts to approximately 1 volt. Thus, a period of clock input ClkA of FIG. 2 may be approximately 10 nanoseconds, resulting in a sample rate frequency of approximately 100 MHz. Sense amplification circuitry, such as sense amplification circuitry 86 of FIG. 5, may further amplify the 1 volt differential voltage output of comparison circuitry 68 in order to produce digital logic signals.

The dominant network time constant of circuitry 10 of FIG. 1 is formed by the total gate-to-source capacitance of $M_1$-$M_n$ in parallel with the total transconductance of $M_1$-$M_n$. If comparison circuitry 68 of FIG. 3 appears as an AC ground during reset, then an input network transfer function is a single-pole response with regard to currents output by $M_1$-$M_n$ through $I_{INi}$-$I_{INn}$, such that $$I_{INi}\text{current}/I_{IN}\text{current} = 1 / [1+jw(Cgs/gm)]$$

$$\text{bandwidth in rad./sec} = w_0 = gm/Cgs$$

This relationship influences the selection of a practical level of current through $I_{DC}$, so that circuitry 10 of FIG. 1 may accommodate a sufficient input bandwidth when current levels through $I_{IN}$ are small. Also, this relationship influences the selection of sizes for direction transistors $M_1$-$M_n$. Calculated input bandwidth for circuitry 10 of FIG. 1 is approximately 270 MHz for a 4-bit (n=15) resolution analog to digital conversion.

In FIG. 13c, a differential voltage between output signals $OUT_i+$ and $OUT_i-$ of comparison circuitry 68 of FIG. 2 is plotted against input bandwidth when current levels through $I_{IN}$ are small. At 3 dB, the input bandwidth is approximately 300 MHz, which closely correlates with the calculated input bandwidth of approximately 270 MHz. Consequently, circuitry 10 of FIG. 1 appears to be suitable for a 100 MHz conversion rate having a corresponding Nyquist frequency of 50 MHz.

If an input current through $I_{IN}$ has a high frequency of variation, then an ability of circuitry 10 of FIG. 1 to accurately sample the input current may be calculated. If the highest frequency of input current variation of interest is a 50 MHz full scale sine wave, then the maximum slew rate of input current through $I_{IN}$ is $$I_{max.slew\ rate\ through\ I_{IN}} = 2(pi)(50e6)(5e-3) = 1.57e6 \text{ A/sec}.$$

For a 4-bit (n=15) resolution analog to digital conversion, each output circuitry $S_i$ has an attenuated maximum slew rate of current through input current path node $I_{INi}$ due to attenuation by $M_i$, such that the maximum slew rate of current through each input current path node $I_{INi}$ is $$I_{max.slew\ rate\ through\ each\ I_{INi}} = 1.047e5 \text{ A/sec.}$$

The maximum slew rate through each $I_{INi}$ is fundamentally important for comparison circuitry 68, because the maximum slew rate indicates a speed at which circuitry 10 of FIG. 1 must regenerate current to ensure that rapidly varying current through $I_{IN}$ does not materially affect an output of comparison circuitry 68 after reset. For a 4-bit (n=15) resolution analog to digital conversion, where current through $I_{IN}$ is approximately 5/16 ma (½ LSB of a full scale current level of approximately 10 ma), a current through input current path node $I_{INi}$ is approximately 21 microamps. At the maximum slew rate computed above, a current through input current path node $I_{INi}$ may slew by 21 microamps in approximately 200 picoseconds.

In a simulation, comparison circuitry 68 successfully maintained a negative voltage at output signal $OUT_i+$ relative to $OUT_i-$, where a current through $I_{IN}$ at a negative edge transition (end of reset) of clock input ClkA was approximately 5/16 ma (½ LSB) below a current necessary for current through $I_{INi}$ to be equal to a current through $I_{REFi}$, and where a maximum positive slew rate (21 microamps in 200 picoseconds) was applied to current through input current path node $I_{INi}$. The ability of the comparison circuitry 68 to maintain a negative voltage at output signal $OUT_i+$ relative to $OUT_i-$ under these conditions indicates that an acceptable period of uncertainty for current through $I_{INi}$ may extend up to at least 200 picoseconds.

Circuitry 10 of FIG. 1 may be used in pipelined architectures, where two or more stages are serially arranged, with each stage performing a comparison based upon results of a comparison by a previous stage. It is also possible to use circuitry 10 of FIG. 1 in a semi-flash pipeline architecture, where two or more stages each have several parallel bits, as for example where a 2-stage pipeline performs an 8-bit A/D conversion in two increments of four bits. Moreover, it is also possible to use voltage mode interfacing with circuitry 10 of FIG. 1, as for example by using high speed transconductors.

Self-calibration controls may also be used in connection with circuitry 10 of FIG. 1, so that automatic circuitry on an integrated circuit governs the accuracy of reference currents $I_{REFi}$ and the accuracy of current division by transistors $M_1$-$M_n$. Without such self-calibration controls, manufacturing variations between transistors might limit a possible number of bits of resolution, due to the importance of accurate reference currents and accurate current division. Accuracy may also be improved by error correction techniques and by dynamic matching techniques.

Although the present invention and its advantages have been described in detail, it should be understood that various changes, substitutions and alterations can be made herein without departing from the spirit and scope of the invention as defined by the appended claims.

What is claimed is:

1. Circuitry for current input analog to digital conversion, comprising:
   an input path for conducting a current input;
   direction circuitry coupled to said input path and operable to direct said current input through a plurality of current paths;
   reference current circuitry for conducting at least one reference current; and
   comparison circuitry coupled between said direction circuitry and said reference current circuitry for comparing a current through each said current path against an associated reference current and outputting a respective output signal indicative thereof, such that said respective output signals are indicative of a magnitude of said current input;
   each said associated reference current is formed by a corresponding scaled current mirror; and
   said associated reference currents are unequal in response to different amplification ratios of said corresponding scaled current mirrors.

2. The circuitry of claim 1 and further comprising a constant current source coupled to said input path for supplying a substantially constant current to said input path, so that said current input is maintained above a predetermined current level.

3. The circuitry of claim 1 wherein said input path comprises first and second input paths, and wherein said current input comprises a differential current between said first and second input paths.

4. The circuitry of claim 1 wherein each said respective output signal comprises a respective differential output signal.

5. The circuitry of claim 4 and further comprising sense amplification circuitry for amplifying each said respective differential output signal to a corresponding digital logic voltage level.

6. Circuitry for current input analog to digital conversion, comprising:
   an input path for conducting a current input;
   direction circuitry coupled to said input path and operable to direct said current input through a plurality of current paths;
   reference current circuitry for conducting at least one reference current;
   comparison circuitry coupled between said direction circuitry and said reference current circuitry for comparing a current through each said current path against an associated reference current and outputting a respective output signal indicative thereof, such that said respective output signals are indicative of a magnitude of said current input;
   each said associated reference current is formed by a corresponding current mirror pair of transistors; and
   said associated reference currents are unequal in response to different amplification ratios of said corresponding current mirror pairs.

7. Circuitry for current input analog to digital conversion, comprising:
   an input path for conducting a current input;
   direction circuitry coupled to said input path and operable to direct said current input through a plurality of current paths;
   reference current circuitry for conducting at least one reference current;
   comparison circuitry coupled between said direction circuitry and said reference current circuitry for comparing a current through each said current path against an associated reference current and outputting a respective output signal indicative thereof, such that said respective output signals are indicative of a magnitude of said current input; and
   current copier circuitry coupled to said input path for providing said current input, such that said current input is substantially constant during a period of time.

8. Circuitry for current input analog to digital conversion, comprising:
   an input path for conducting a current input;
   direction circuitry coupled to said input path and operable to direct said current input through a plurality of current paths;
   reference current circuitry for conducting at least one reference current;
   comparison circuitry coupled between said direction circuitry and said reference current circuitry for comparing a current through each said current path against an associated reference current and outputting a respective output signal indicative thereof, such that said respective output signals are indicative of a magnitude of said current input; and
   current copier circuitry coupled between said direction circuitry and said comparison circuitry for providing said currents through said current paths, such that each said current is substantially constant during a period of time.

9. Circuitry for current input analog to digital conversion, comprising:
   an input path for conducting a current input;
   direction circuitry coupled to said input path and operable to direct said current input through a plurality of current paths;
   reference current circuitry for conducting at least one reference current;
   comparison circuitry coupled between said direction circuitry and said reference current circuitry for comparing a current through each said current path against an associated reference current and outputting a respective output signal indicative thereof, such that said respective output signals are indicative of a magnitude of said current input; and
   said comparison circuitry comprises a plurality of comparison modules, each said comparison module comprising a resettable latch coupled to a corresponding one of said current paths and to said reference current circuitry.

10. The circuitry of claim 9 wherein said resettable latch comprises first and second inverters, wherein said resettable latch is operable to reset in response to a reset signal on a reset signal line.

11. Circuitry for current input analog to digital conversion, comprising:
    an input path for conducting a current input;
    direction circuitry coupled to said input path and operable to direct said current input through a plurality of current paths;
    reference current circuitry for conducting at least one reference current;

comparison circuitry coupled between said direction circuitry and said reference current circuitry for comparing a current through each said current path against an associated reference current and outputting a respective output signal indicative thereof, such that said respective output signals are indicative of a magnitude of said current input; and said comparison circuitry comprises an inverter having an input coupled to a corresponding one of said current input, paths and to said reference current circuitry.

12. The circuitry of claim 11 wherein said comparison circuitry further comprises a clamping circuit for substantially limiting a voltage swing at said input of said inverter.

13. Circuitry for current input analog to digital conversion, comprising:
an input path for conducting a current input;
direction circuitry comprising a plurality of transistors coupled to said input path and operable to direct said current input through respective current paths;
reference current circuitry for conducting at least one reference current;
comparison circuitry coupled between said direction circuitry and said reference current circuitry for comparing a current through each said respective current path against an associated reference current and outputting a respective output signal indicative thereof, such that said respective output signals form a thermometer code output indicative of a magnitude of said current input;
each said associated reference current is formed by a corresponding scaled current mirror; and
said associated reference currents are unequal in response to different amplification ratios of said corresponding scaled current mirrors.

14. The circuitry of claim 13 wherein said thermometer code output is linearly scaled.

15. The circuitry of claim 13 wherein said thermometer code output is non-linearly scaled.

16. The circuitry of claim 13 and further comprising encoding circuitry for encoding said thermometer code output into binary code.

17. The circuitry of claim 13 and further comprising encoding circuitry for encoding said thermometer code output into gray code.

18. The circuitry of claim 13 and further comprising encoding circuitry for encoding said thermometer code output into two's complement code.

19. The circuitry of claim 13 wherein said transistors direct said input current through said respective current paths, such that said currents through said respective current paths are substantially equal.

20. The circuitry of claim 19 wherein said associated refer fence currents are unequal, such that said respective output signals form said thermometer code output indicative of said magnitude of said current input.

21. Circuitry for current input analog to digital conversion, comprising:
an input path for conducting a current input;
direction circuitry comprising a plurality of transistors coupled to said input path and operable to direct said current input through respective current paths, such that said currents through said respective current paths are unequal;
reference current circuitry for conducting at least one reference current;
comparison circuitry coupled between said direction circuitry and said reference current circuitry for comparing a current through each said respective current path against an associated reference current and outputting a respective output signal indicative thereof, such that said respective output signals form a thermometer code output indicative of a magnitude of said current input.

22. The circuitry of claim 21 wherein said associated reference currents are substantially equal, such that said respective output signals form said thermometer code output indicative of said magnitude of said current input.

23. The circuitry of claim 21 wherein each said transistor has a corresponding channel width such that said currents through said respective current paths are unequal.

24. The circuitry of claim 21 wherein a variable number of said transistors are substantially turned on in response to said magnitude of said current input.

25. The circuitry of claim 24 wherein each said transistor has a gate coupled through first and second associated resistances to first and second bias voltages, respectively, such that said variable number of said transistors is based upon said magnitude of said current input., 26. The circuitry of claim 24 wherein each said transistor has a gate coupled to an associated one of said respective output signals, such that said variable number of said transistors is based upon a number of said respective output signals that are enabled in response to said magnitude of said current input.

27. The circuitry of claim 24 wherein each said transistor has a source/drain coupled through an associated resistance to said input path, such that said variable number of said transistors is based upon said magnitude of said current input.

28. Circuitry for current input analog to digital conversion, comprising:
an input path for conducting a current input;
direction circuitry coupled to said input path and operable to direct said current input through a plurality of current paths;
reference current circuitry for conducting at least one reference current; and
comparison circuitry comprising a plurality of comparison modules for outputting differential voltages indicative of a magnitude of said current input, each said comparison module comprising:
reset circuitry for substantially minimizing a corresponding one of said differential voltages during a reset signal on a reset signal line;
equalization circuitry for limiting a maximum differential voltage of said corresponding differential voltage after said reset signal; and
regeneration circuitry for moving said corresponding differential voltage in a positive direction responsive to a current through a corresponding one of said current paths exceeding an associated reference current and for moving said differential voltage in a negative direction responsive to said associated reference current exceeding said current through said corresponding current path.

29. The circuitry of claim 28 wherein each said corresponding differential voltage is formed between a respective first output node coupled to said corresponding current path and a respective second output node coupled to said reference current circuitry.

30. The circuitry of claim 29 and further comprising:
a first capacitance transistor having first and second source/drains coupled to said first output node, and a gate coupled to an inverted reset signal line, such that said first capacitance transistor diminishes a charge at said first output node after said reset signal; and
a second capacitance transistor having first and second source/drains coupled to said second output node, and a gate coupled to said inverted reset signal line, such that said second capacitance transistor diminishes a charge at said second output node after said reset signal.

31. The circuitry of claim 30 wherein said first capacitance transistor supplies charge to said first output node after said reset signal, and wherein said second capacitance transistor supplies charge to said second output node after said reset signal.

32. A method of current input analog to digital conversion, comprising the steps of:
conducting a current input through an input path;
directing said current input through a plurality of current paths;
conducting at least one reference current;
comparing a current through each said current path against an associated reference current and outputting a respective output signal indicative thereof, such that said respective output signals are indicative of a magnitude of said current input;
forming said associated reference current with a corresponding scaled current mirror; and
forming said associated reference currents unequal in response to different amplification ratios of said corresponding scaled current mirrors.

33. The method of claim 32 and further comprising the step of supplying a substantially constant current to said input path, so that said current input is maintained above a predetermined current level.

34. The method of claim 32 wherein said step of conducting said current input comprises the step of conducting a differential current between first and second input paths.

35. The method of claim 32 wherein said step of comparing said current comprises the step of outputting each said respective output signal as a respective differential output signal.

* * * * *